(12) United States Patent
Behfar et al.

(10) Patent No.: US 8,064,493 B2
(45) Date of Patent: Nov. 22, 2011

(54) SURFACE EMITTING PHOTONIC DEVICE

(75) Inventors: Alex Behfar, Irvine, CA (US); Cristian Stagarescu, Ithaca, NH (US)

(73) Assignee: BinOptics Corporation, Ithaca, NY (US)

( * ) Notice: Subject to any disclaimer, the term of this patent is extended or adjusted under 35 U.S.C. 154(b) by 0 days.

(21) Appl. No.: 12/725,894

(22) Filed: Mar. 17, 2010

(65) Prior Publication Data

US 2010/0316076 A1  Dec. 16, 2010

Related U.S. Application Data

(60) Provisional application No. 61/186,730, filed on Jun. 12, 2009.

(51) Int. Cl.
*H01S 5/00* (2006.01)
(52) U.S. Cl. .............. 372/43.01; 372/45.01; 372/50.11; 372/64
(58) Field of Classification Search ............ 372/43.01, 372/45.01, 50.11
See application file for complete search history.

(56) References Cited

U.S. PATENT DOCUMENTS

| | | | |
|---|---|---|---|
| 2005/0079658 A1* | 4/2005 | Li et al. ........................ 438/189 |
| 2005/0083982 A1 | 4/2005 | Behfar | |
| 2005/0123016 A1* | 6/2005 | Behfar et al. ................. 372/50 |
| 2005/0147145 A1 | 7/2005 | Behfar et al. | |
| 2006/0291514 A1 | 12/2006 | Behfar et al. | |
| 2008/0298413 A1 | 12/2008 | Behfar et al. | |
| 2010/0021171 A1* | 1/2010 | Wang et al. .................... 398/82 |

OTHER PUBLICATIONS

Chao, et al., "Low-Threshold, High-Power, 1.3-um Wavelength, InGaAsP-InP Etched-Facet Folded-Cavity Surface-Emitting Lasers," IEEE Photonics Technology Letters, vol. 7, No. 8, Aug. 1995, 3 pages.

International Search Report and Written Opinion of the International Searching Authority, the United States Patent and Trademark Office, for PCT/US2010/038359, dated Aug. 20, 2010, 8 pages.

* cited by examiner

*Primary Examiner* — Dung Nguyen
(74) *Attorney, Agent, or Firm* — Wilmer Cutler Pickering Hale and Dorr LLP

(57) ABSTRACT

A surface emitting photonic device including a substrate; and a waveguide structure on the substrate. The waveguide structure includes an active region along its longitudinal axis and the active region is for generating light. The waveguide structure also has a trench formed therein transverse to the active region and defining a first wall forming an angled facet at one end of the active region, the first wall having a normal that is at a non-parallel angle relative to the longitudinal axis of the waveguide structure. The trench also defines a second wall located opposite the first wall.

21 Claims, 25 Drawing Sheets

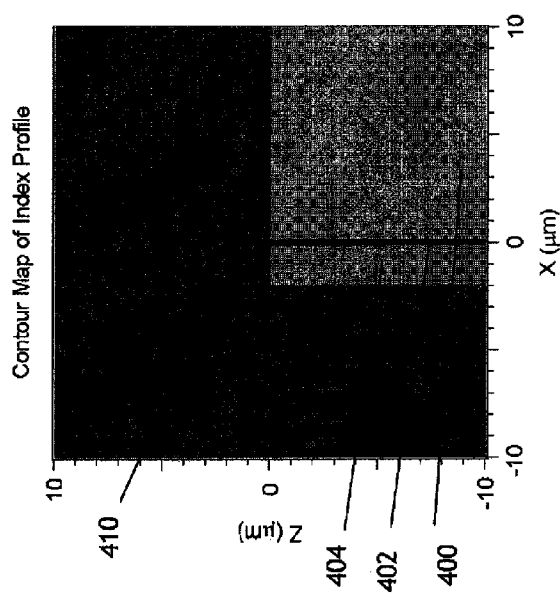
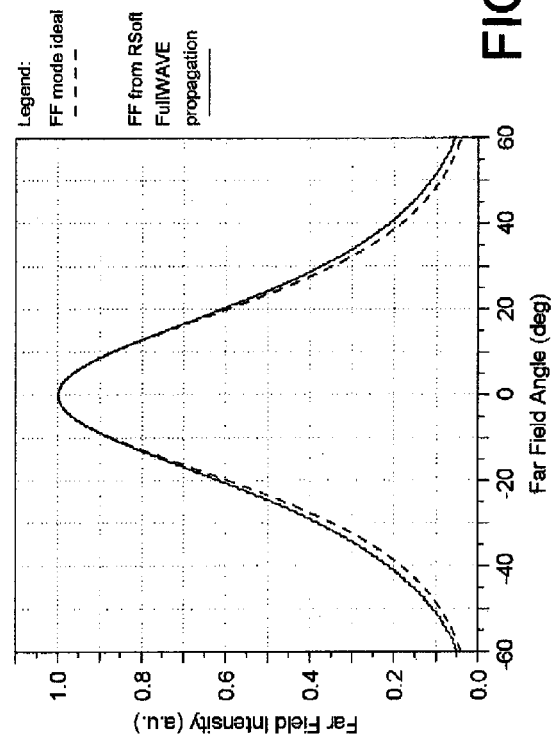
FIG. 18(A)
FIG. 18(B)

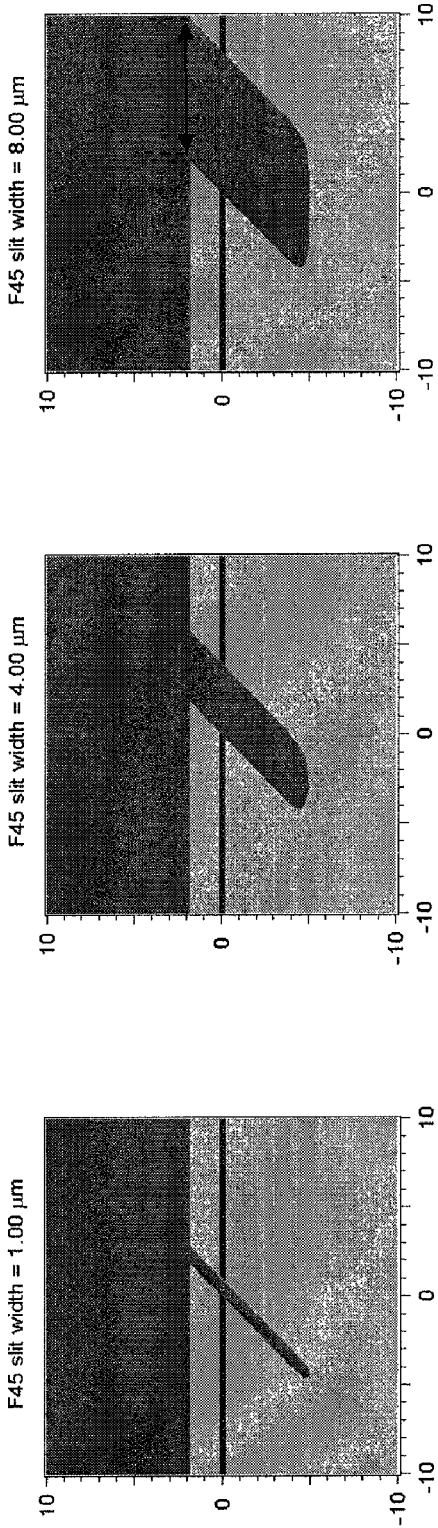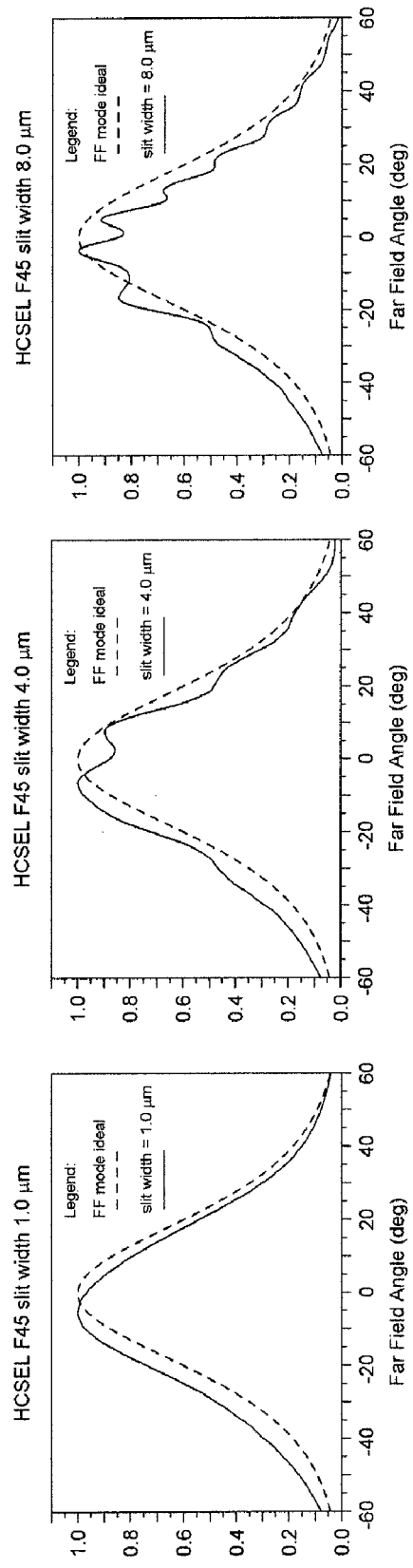
FIG. 30(A)  FIG. 30(C)  FIG. 30(E)
FIG. 30(B)  FIG. 30(D)  FIG. 30(F)

SURFACE EMITTING PHOTONIC DEVICE

CROSS REFERENCE TO RELATED APPLICATIONS

This application claims the benefit of U.S. Provisional Application No. 61/186,730, filed Jun. 12, 2009, and incorporated herein by reference.

This application is related to U.S. application Ser. No. 10/958,069, filed Oct. 5, 2004, and entitled "Surface Emitting and Receiving Photonic Device;" U.S. Provisional Application No. 60/512,189, filed Oct. 20, 2003; and, U.S. Provisional Application No. 60/578,289, filed Jun. 10, 2004, the disclosures of which are hereby incorporated herein by reference.

BACKGROUND OF THE INVENTION

The present invention relates, in general, to surface emitting and receiving photonic devices, and more particularly to improved surface emitting laser devices and methods for fabricating them.

Semiconductor lasers typically are fabricated by growing the appropriate layered semiconductor material on a substrate through Metalorganic Chemical Vapor Deposition (MOCVD) or Molecular Beam Epitaxy (MBE) to form an active layer parallel to the substrate surface. The material is then processed with a variety of semiconductor processing tools to produce a laser optical cavity incorporating the active layer, and metallic contacts are attached to the semiconductor material. Finally, laser mirror facets typically are formed at the ends of the laser cavity by cleaving the semiconductor material to define edges or ends of the laser optical cavity so that when a bias voltage is applied across the contacts the resulting current flow through the active layer causes photons to be emitted out of the faceted edges of the active layer in a direction perpendicular to the current flow.

The prior art also discloses processes for forming the mirror facets of semiconductor lasers through etching, allowing lasers to be monolithically integrated with other photonic devices on the same substrate. The formation of total-internal-reflection facets within an optical cavity through the creation of such facets at angles greater than the critical angle for light propagating within the cavity is also known.

The use of an etch process to form two total-internal-reflection facets at each end of a linear laser cavity, with each facet being positioned at an angle of 45° with respect to the plane of the active layer, is also described in the prior art. In such devices, light in the cavity may be directed perpendicularly upward at one end of the cavity, resulting in surface emission at one facet, while the facet at the other end of the cavity may be oppositely angled to direct the light perpendicularly downward to, for example, a high reflectivity stack below the laser structure.

The prior art also describes devices which combine etched 45° facets with cleaved facets. The resultant devices cannot be tested in a full-wafer and as such suffer from the same deficiencies as cleaved facet devices. Furthermore, they are incompatible with monolithic integration in view of the need for cleaving. Chao, et al., IEEE Photonics Technology Letters, volume 7, pages 836-838, attempted to overcome these short-comings, however, by providing an interrupted waveguide structure, but the resultant device suffered from scatter at each end of the laser cavity.

Vertical Cavity Surface Emitting Lasers (VCSELs), have gained popularity over the past several years; however, VCSELs do not allow in-plane monolithic integration of multiple devices and only allow light to exit their surface mirror at perpendicular incidence. A common aspect of these prior surface-emitting devices is that the photons are always emitted from the optical cavity in a direction perpendicular to the plane of the active layers.

A laser with low to no ripples in its far-field intensity profile is very desirable, for example, in efficient coupling of the laser beam into an optical fiber.

SUMMARY OF THE INVENTION

In general, in one aspect, the invention features a surface emitting photonic device including: a substrate and a waveguide structure on the substrate. The waveguide structure includes along its longitudinal axis an active region for generating light. The waveguide structure has a trench formed therein transverse to the active region and defining a first wall forming an angled facet at one end of the active region, the first wall having a normal that is at a non-parallel angle relative to the longitudinal axis of the waveguide structure, the trench also defining a second wall located opposite the first wall.

Other embodiments include one or more of the following features. The first and second walls of the trench define an opening in waveguide structure that is no greater than one of 8 μm, 4 μm or 1 μm. The waveguide structure is made of a semiconductor material and it has a top surface wherein the first wall is at an angle relative to the top surface of about 44.4°±1°. In general, the facet is internally reflective and angled to cause light generated in the active region to be emitted in a direction that is substantially perpendicular to the substrate. The waveguide structure is made up of multiple layers on a top surface of the substrate and the active region is substantially parallel to that top surface. The device also included electrodes on the waveguide structure and the substrate for receiving a bias voltage to activate the waveguide structure to generate a laser output beam. The device is a ridge laser (e.g. a buried heterostructure laser, a Fabry Perot laser, a distributed feedback laser. The waveguide structure is shaped to form an elongated laser cavity having the first facet at a first end of that cavity and having a second facet at a second end of that cavity. The trench has an etched base that is parallel to the substrate or rounded. The second wall has a normal that is parallel to the longitudinal axis of the waveguide structure.

The details of one or more embodiments are set forth in the accompanying drawings and the description below. Other features, objects, and advantages of the described embodiments will be apparent from the description and drawings, and from the claims.

BRIEF DESCRIPTION OF DRAWINGS

The foregoing, and additional objects, features and advantages will be apparent to those of skill in the art from the following detailed description of preferred embodiments thereof, taken with the accompanying drawings, in which:

FIG. 7 is a top perspective view of a fifth embodiment of a surface-emitting laser.

FIGS. 18(A) and (B) show a 2-d waveguide structure with a perpendicular etched facet, the far-field corresponding to this structure, and the far-field from FIG. 17 for comparison.

FIGS. 30(A)-(F) show three 2-d waveguide structures with a 45.0° etched facet with rounding at the etched base, each with a different width for the angle-etched slit, and far-fields corresponding to these structures with comparisons with the far-field from FIG. 17.

DETAILED DESCRIPTION OF PREFERRED EMBODIMENTS

Figure 1:
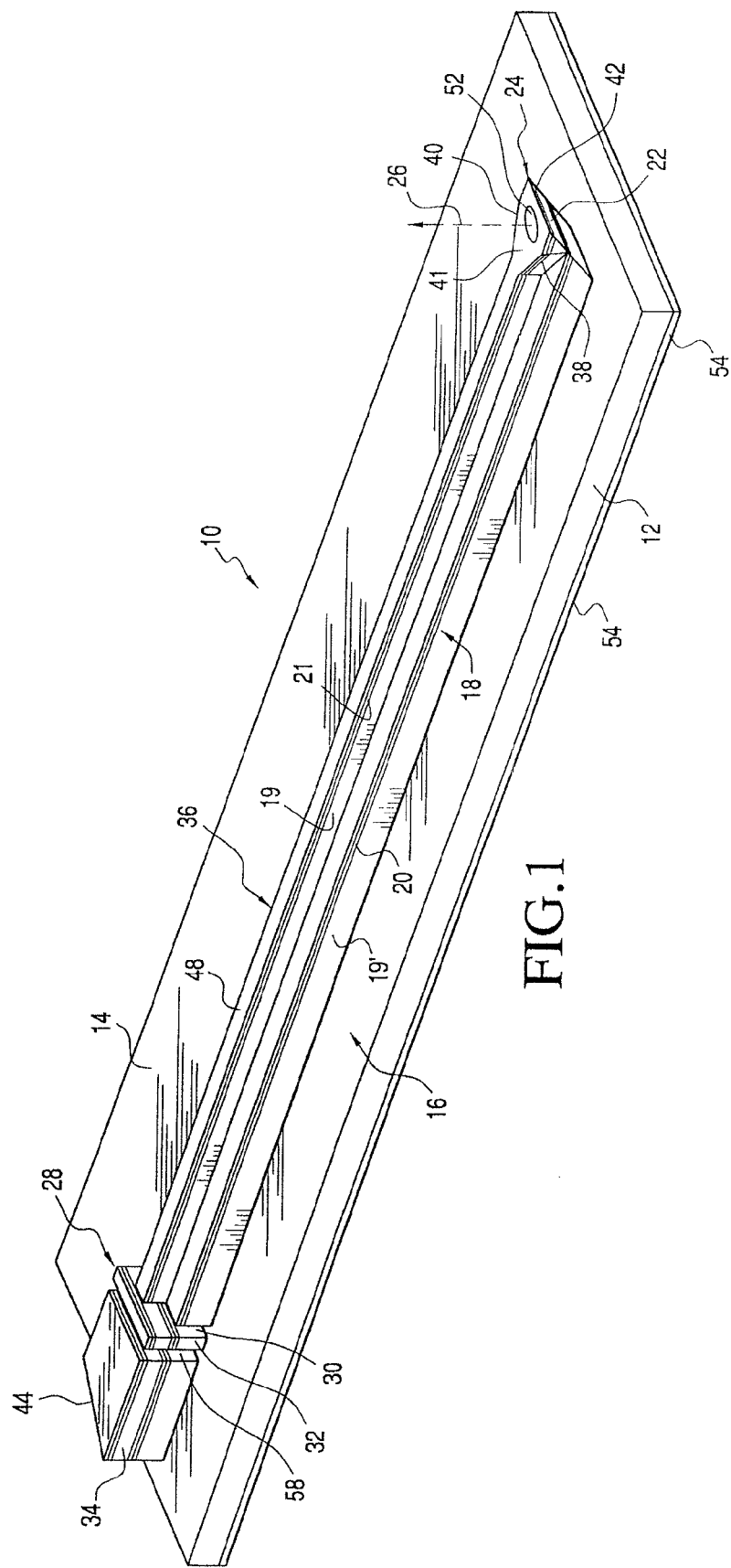
FIG. 1 is a top perspective view of a first embodiment of a surface-emitting laser.
Figure 2:
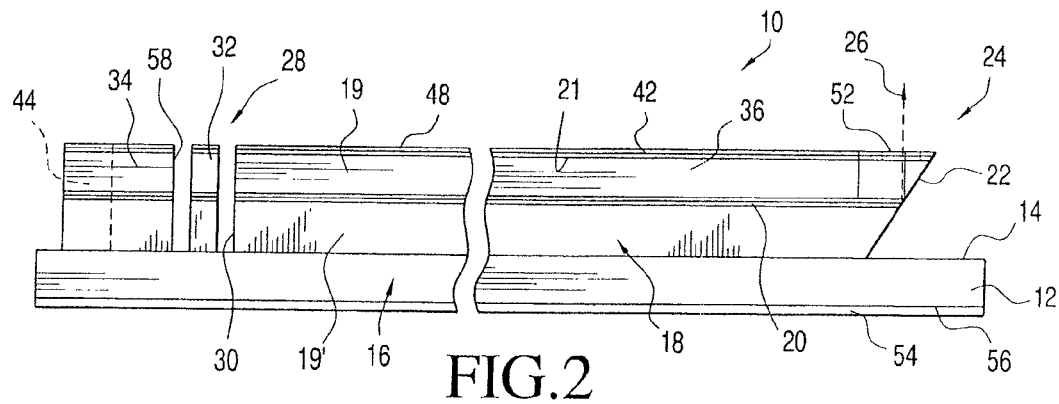
FIG. 2 is a side elevation of the laser of FIG. 1.
Figure 3:
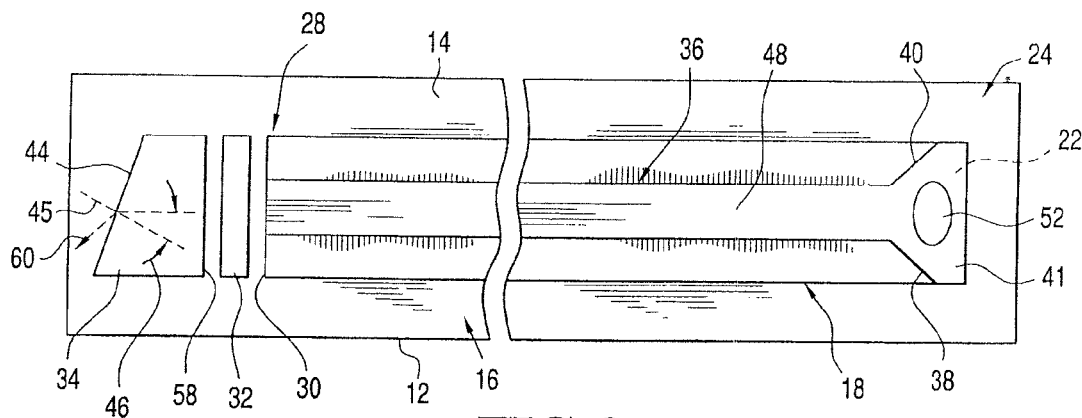
FIG. 3 is a top plan view of the laser of FIG. 1.

Turning now to a more detailed description of an exemplary embodiment, a surface emitting semiconductor laser 10 fabricated on a substrate 12 is illustrated diagrammatically in FIGS. 1-3. Although a ridge laser is described, it will be understood that other types of lasers may be fabricated utilizing the features described herein. For example, the laser structure can also be a buried heterostructure (BH) laser. The type of laser can be a Fabry Perot (FP) laser or a distributed feedback (DFB) laser.

As is conventional in the fabrication of solid state ridge lasers, the substrate 12 may be formed, for example, of a type III-V compound, or an alloy thereof, which may be suitably doped. The substrate includes a top surface 14 on which is deposited, as by an epitaxial deposition such as Metalorganic Chemical Vapor Deposition (MOCVD) or Molecular Beam Epitaxy (MBE), a succession of layers generally indicated at 16 which form an optical cavity 18 that includes an active region 20. A horizontal cavity semiconductor laser structure such as the optical cavity 18 typically contains upper and lower cladding regions 19 and 19', formed from lower index semiconductor material than the active region 20, such as InP, adjacent the active region 20, which may be formed with InAlGaAs-based quantum wells and barriers. A transition layer 21 of InGaAsP is formed on the top surface of cladding region 19.

An angled facet 22 is formed at a first, or emitter end 24 of the cavity 18 by a masking and etching process in which the facet is etched downwardly and inwardly at or near a 45° angle with respect to the surface 14. This facet is angled to cause light generated in the optical cavity to be emitted in a direction that is essentially perpendicular, or close to perpendicular, to the plane of the active region 20 and to the surface 14. Stated differently, the normal of the angled facet is about 45° relative to the normal of the surface and about 45° relative to the longitudinal axis of the optical cavity 18. The emitter end facet 22 is substantially totally internally reflective so that light propagating along the longitudinal axis of the optical cavity 18 is reflected in a direction perpendicular to this axis, and this travels vertically upwardly in the direction of arrow 26, as viewed in the Figs.

At a second, or reflective end of the optical cavity, generally indicated at 28, an end facet 30 is formed at an angle of 90° with respect to the longitudinal axis of the cavity, and thus substantially perpendicular to the active region 20 of the laser. In addition, a distributed Bragg reflector (DBR) element 32 and a monitoring photo detector (MPD) 34 are formed at end 28, facet 30 and elements 32 and 34 being formed through masking and etching in known manner. A ridge 36 extending between emitter end 24 and reflective end 28 is formed by masking and etching the optical cavity 18 above the active region 20 to form the ridge-type laser 10. At the emitter end 24, the ridge 36 is widened, or tapered outwardly, as at edges 38 and 40, to provide an open area 41 above the facet 22 to allow the beam 26 to emerge through the top surface 42 of the optical cavity 18 without distortion.

The back of the MPD portion 34 which is the left-hand end as viewed in FIGS. 1-3, is etched to form an exit facet 44. A line 45 perpendicular to the surface of facet 44 forms an angle 46 with respect to the longitudinal axis of the optical cavity 18 (FIG. 3) at or near the Brewster angle for the material from which the laser 10 is fabricated, so that facet 44 has zero or near-zero reflectivity for light generated in cavity 18. Some of the laser light generated in the optical cavity 18 and propagating longitudinally is emitted at facet 30, passes through the Bragg reflector 32, and is received by MPD 34 which monitors the operation of the laser. A portion of this light reaches facet 44, but is dissipated at that facet because of its zero or near-zero reflectivity, and this prevents undesirable back reflection to the laser.

A top electrical contact layer 48 on the top surface 42 of the ridge 36 is typically a low bandgap semiconductor, such as InGaAs, that allows ohmic contacts to be formed with a metal layer applied to it. The transition layer 21 typically is a semiconductor having a bandgap that is between that of the upper cladding layer 19 and that of the contact layer 48, and in some cases may have a variable bandgap. The contact layer and the transition layer may absorb the light generated in the laser. For example, if an optical cavity 18 having the materials described above generates laser light with 1310 nm in wavelength, the InGaAs contact layer 48 will absorb this light after it is reflected upward from the 45° total internal reflection facet illustrated at 22. Additionally, if the bandgap of the InGaAsP transition layer 21 is smaller than about 0.95 eV, corresponding to a wavelength of 1310 nm, then the transitional layer will also lead to absorption. Removal of any absorbing layers is, therefore, important to the efficient and reliable operation of the laser. This is accomplished, as illustrated in FIG. 1, by providing an aperture 52, in accordance with the first embodiment. On the other hand, if the laser wavelength is 980 nm and the contact layer is GaAs, there is no need to remove the GaAs contact layer, since it is transparent at that wavelength, but if the lasing wavelength is 830 nm, then removal of the GaAs contact layer would be desirable. The aperture 52 is formed in contact layer 48 by a patterning and etching process, with the opening being located at the open area 41 of the ridge at emitter end portion 24. This aperture allows light to be emitted from the laser cavity, as described above. It is noted that the beam will normally have a circular or elliptical shape.

The top electrode is deposited on contact layer 48 on the laser and MPD, and a second electrode 54 is deposited on a bottom surface 56 of the substrate, so that a bias voltage can be applied across the ridge 36 between the electrodes to produce lasing. A zero or negative bias can also be applied across the MPD to allow it to generate an electrical current based on the light that impinges upon it. Laser light propagating in the optical cavity 18 will be reflected by facet 22 to exit vertically at first end 24, as indicated by arrow 26, and some light will exit horizontally, in the plane of the active region 20, through the facet 30 at second end 28. Some of the light exiting through facet 30 will be reflected back into the cavity by the DBR reflector 32 and some will pass through reflector 32 to impinge on the front surface 58 of the MPD 34, where it will be detected. Light which passes through the MPD will be dissipated by facet 44, as indicated by arrow 60 (FIG. 3) at the back of the MPD. The monolithically fabricated MPD 34 is not limited to monitoring the operation of the laser, as by measuring its intensity in this configuration, for if desired the MPD can also be used as an extremely fast detector to provide feedback to a circuit that drives the laser.

A laser cavity can be optimized by using reflectivity modification coatings. In conventional cleaved-facet lasers, one facet may have a high reflectivity coating while the other facet may be coated to lower reflectivity, for example 90% and 10% reflectivity, respectively, so that most of the laser light emerges from the lower reflectivity facet. In short cavities both facets may have high reflectivity to reduce the cavity round-trip loss, but typically one facet will have a lower reflectivity than the other, for example 99.9% and 99.0% nominal reflectivity, respectively, to allow most of the laser light to emerge from the lower reflectivity facet. In a second embodiment, illustrated in FIG. 4, the laser 10 is fabricated in the manner described above, with common elements having the same reference numerals. However, in this case a dielectric layer or stack 70 is deposited on the open area 41 at the first end 24 of the ridge 36 so that it modifies the reflectivity that emitted beam 26 experiences. In addition, as illustrated in FIG. 5, the facet 30 at the reflector end 28 of the optical cavity 18 may incorporate an optical layer or stack 72 instead of the Bragg reflector 32. The use of very high reflectivity coatings at both ends of a very short cavity of below around 5 μm can produce single mode behavior due to the large longitudinal mode spacing of a very short cavity. Modifications in reflectivity can be used to optimize the performance of the laser cavity.

Figure 6:
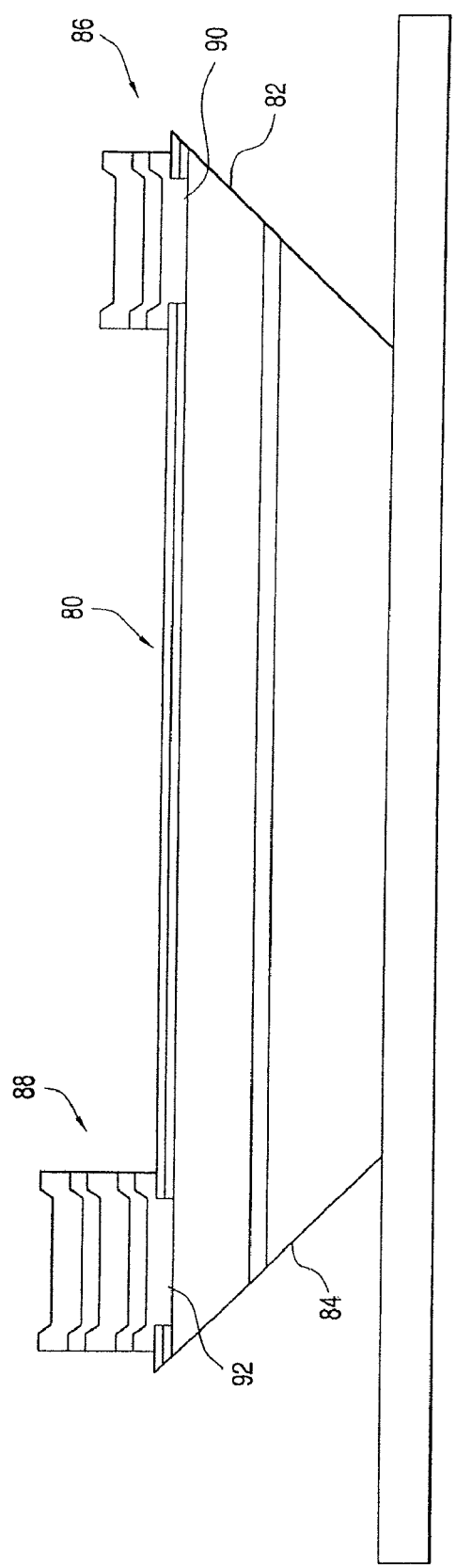
FIG. 6 is a side elevation of a fourth embodiment of a surface-emitting laser.

Instead of having the back end facet 30 of the laser cavity 18 be a vertical facet, that facet can also be etched at a 45-degree angle as illustrated in FIG. 6. In this figure, a laser cavity 80, fabricated as described above, is etched at both ends to provide angled facets 82 and 84. This type of laser provides horizontal surfaces for corresponding reflective coatings 86 and 88 formed over apertures 90 and 92, respectively. The illustrated structures can emit light that is perpendicular to the substrate at both the back facet 84 and the front facet 82, with the apertures being provided to avoid absorption in the contact layer and transition layers.

Single longitudinal mode lasers are more desirable than multi-longitudinal mode lasers in many applications. One such application is in data communications where longer reaches of communications are obtained with a single longitudinal mode lasers compared to a multi-longitudinal laser. FIG. 7 illustrates an embodiment wherein a single longitudinal mode surface emitting semiconductor laser 100 is fabricated on a top surface 112 of a substrate 114. As described above for laser 10, a succession of layers 116 forms an optical cavity 118 that includes an active region (not shown) fabricated as described above. An angled facet 122 is formed at a first end 120 through masking and etching downwardly and inwardly at or near a 45° angle with respect to surface 112. The facet is substantially totally internally reflective so that the laser emits an essentially vertical or close to vertical output beam 126. At the second end 128 of the optical cavity, a vertical end facet 130, which is perpendicular to the active layer of the laser, multiple filtering elements 132, a distributed Bragg reflector (DBR) element 134, and a monitoring photo detector (MPD) 136 are formed along the optical axis of cavity 118 through masking and etching. An elongated ridge 140 is formed from the cavity 118 by a masking and etching process.

At the emitter end 120 of the laser, the ridge 140 is enlarged outwardly, as illustrated by side walls 142 and 144, to form an open area 145 to allow the beam 126 to be emitted through the surface of the first end without distortion, as described above with respect to FIG. 1. At the second end 128, the back of the MPD portion 136 is etched to form an exit facet 146 which designed to form an angle at or near the Brewster angle for the laser material, so as to have zero or near-zero reflectivity. After passing through filtering elements 132 and DBR element 134, some of the laser light generated in optical cavity 118 is received by MPD 136, which then provides a measure of the operation of the laser. Any light that reaches facet 146 is dissipated because of its zero or near-zero reflectivity to prevent undesirable back reflection to the laser.

After the etching steps described above, a top electrical contact layer (not shown) such as that described with respect to FIG. 1 is formed on the top surface of the ridge and on the MPD, and this layer is patterned so as to provide an opening 148 in the contact layer in the open area 145. This opening is located over the facet 122 at end portion 120 to permit light generated in the laser cavity to be emitted in a circular or elliptical shape, as beam 126.

A second electrical contact layer (not shown) is deposited on the bottom surface of the substrate, so that a bias voltage can be applied across the ridge to produce lasing and a zero or negative bias can be applied across the MPD to allow it to generate an electrical current based on the light that impinges upon it. The laser light so produced in the optical cavity will exit vertically at first end 120, as indicated by arrow 126, and longitudinally at second end 128, where some light will be transmitted through the facet 130, through filters 132, and through the DBR element 134, and will impinge on the front end 150 of the MPD 136 to be detected by the MPD and then dissipated at the back facet 146 of the MPD.

Figure 4:
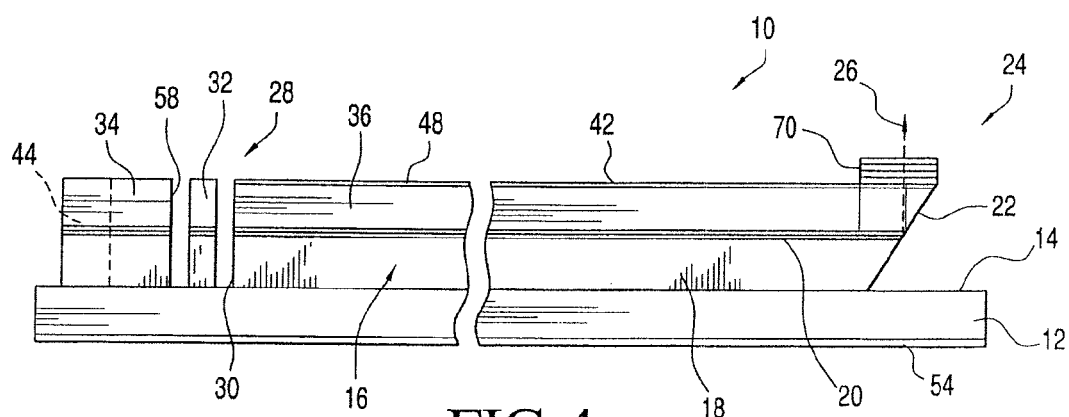
FIG. 4 is a side elevation of a second embodiment of a surface-emitting laser.
Figure 5:
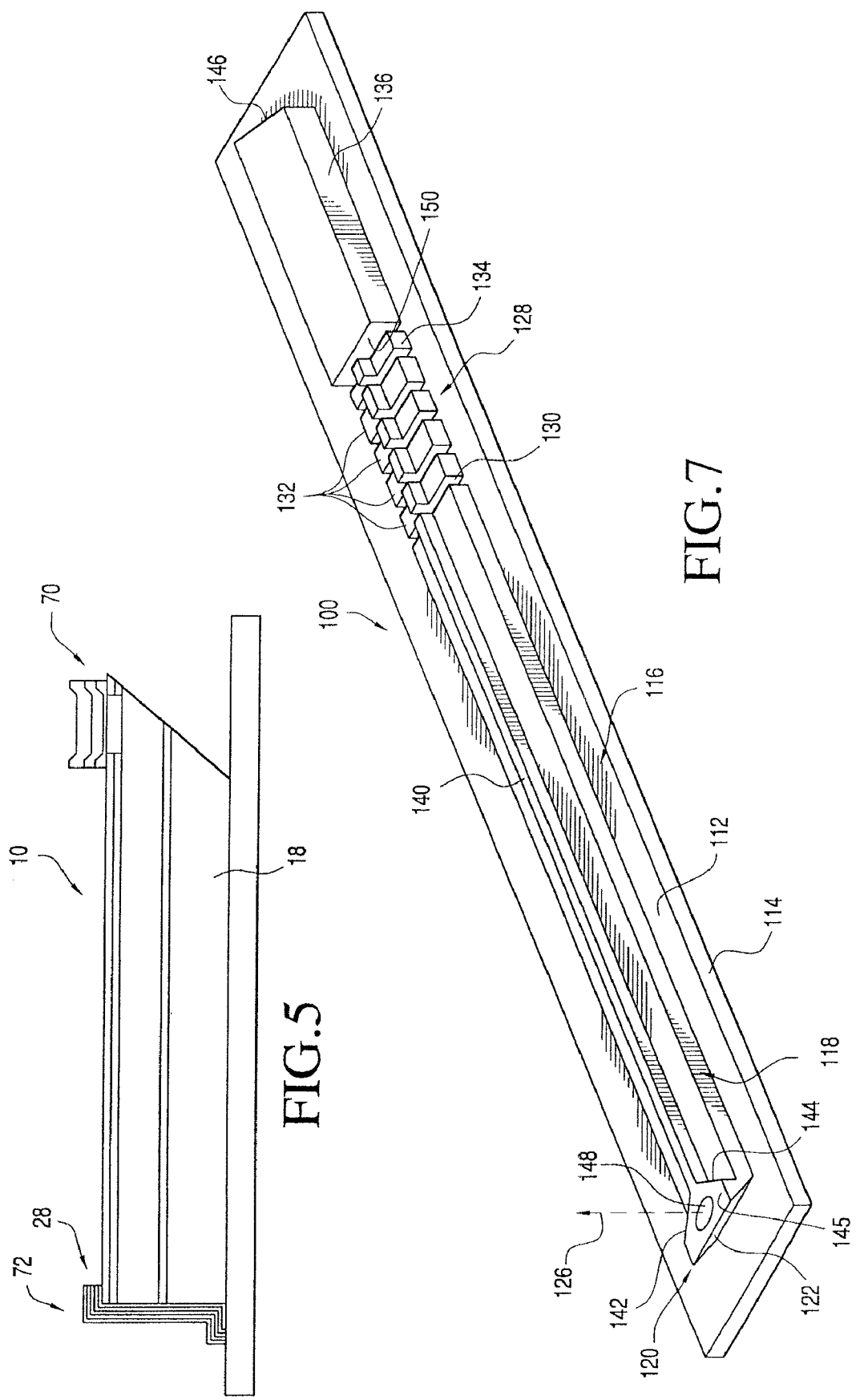
FIG. 5 is a side elevation of a third embodiment of a surface-emitting laser.

As is the case with the device of FIGS. 1-3, the single longitudinal mode device 100 of FIG. 7 can have a dielectric layer or stack (not shown) deposited at the first emitter end 120 of the ridge, in the manner illustrated in FIG. 4, so that it modifies the reflectivity of the emitter end.

Although single DBR elements 32 and 134 are illustrated in the embodiments of FIGS. 1 and 7, respectively, it will be understood that multiple DBR elements could also be used to obtain higher reflectivity at the second ends 28 and 128, respectively. The DBR elements can take the form of element 32 in FIG. 1 where the DBR is not patterned during the ridge etch so that it does not acquire the ridge configuration, or can take the form of element 134 in FIG. 5 where the element includes the ridge shape. Furthermore, it will be understood that the DRB element(s) can be replaced by dielectric reflectivity modification layer or stack.

Figure 8:
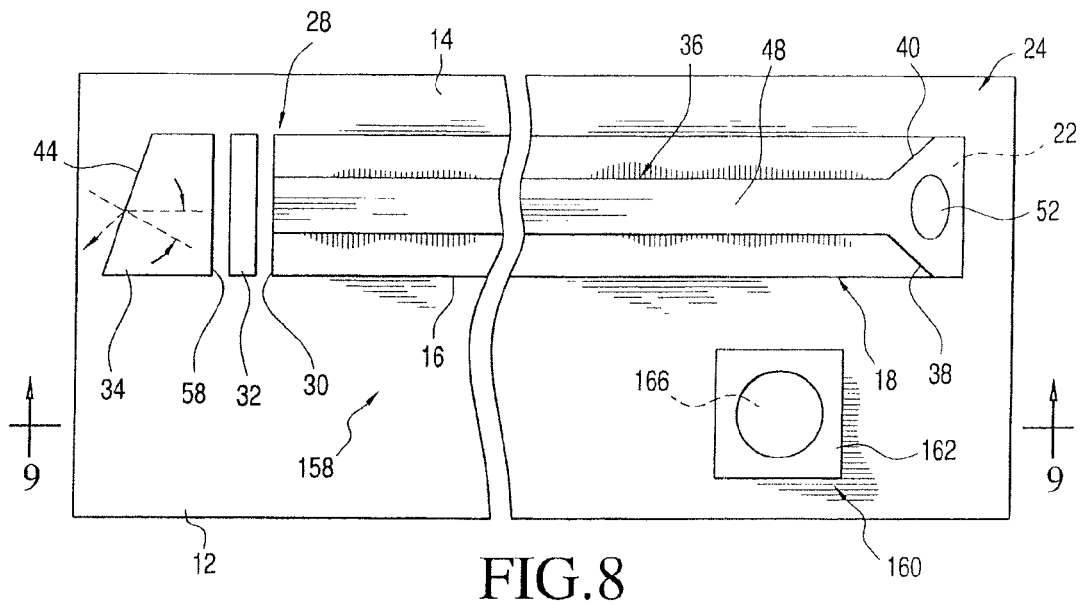
FIG. 8 is a top plan view of a sixth embodiment, combining a surface emitting laser and an area detector.
Figure 9:
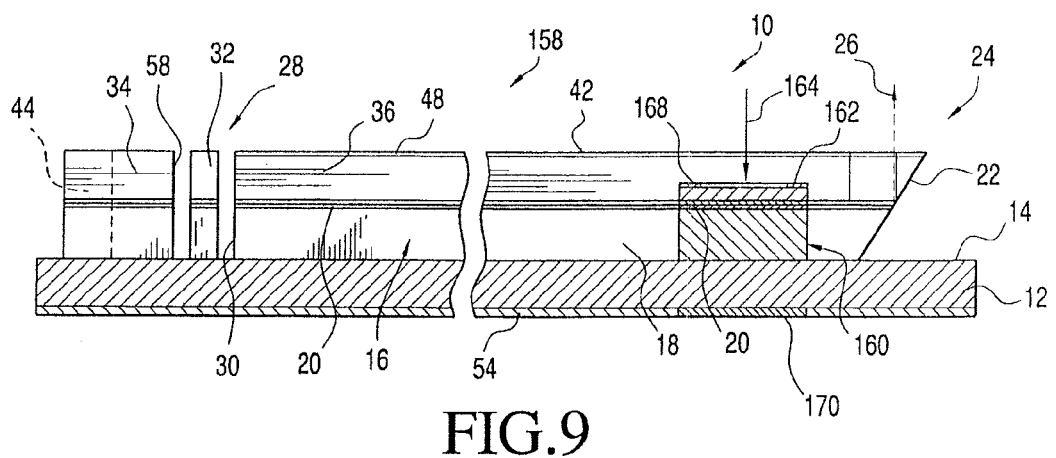
FIG. 9 is a side elevation in partial section of the laser and area detector of FIG. 8.

In modern systems, it is highly desirable to have a transmitter of light and a detector of light side-by-side on a single substrate, or chip. Having such a combination is even more desirable if the devices are made out of the same material. Accordingly, in the embodiment illustrated in FIGS. 8 and 9, a surface emitting, or vertically emitting, laser 158, which may be a laser such as the laser 10 of FIG. 1, is combined with a detector 160 to provide both a light emitter and a light detector on a common substrate, such as the substrate 12 of FIG. 1. The surface-emitting laser 158 is similar to that of FIG. 1 for purposes of illustration, and common features are similarly numbered, but it will be apparent that variations of the surface emitter can be used. FIG. 9 is a cross-sectional view taken along line 9-9 of FIG. 8 to illustrate the structure of detector 160. For the sake of clarity, in FIG. 9 the detector is shown to have a height smaller than the laser, but this is not a requirement.

Area detector 160 is located adjacent to surface emitting laser 158, as illustrated, and is fabricated from the same layers 16 as were deposited on the substrate to form the optical cavity. The detector is masked and etched in these layers during the masking and etching steps used for forming the second end 28 of the laser, which steps include formation of the vertical end facet 30 (which is perpendicular to the active layer of the laser), the distributed Bragg reflector (DBR) element 32, and the monitoring photo detector (MPD) 34.

The area detector 160, in the illustrated configuration, may be generally rectangular with a top surface 162 that receives an impinging beam 164 within a detection area 166, and uses the same active layer 20 as the one used in the laser 10. A top electrical contact 168 is applied on the top surface 162 of the detector, while leaving the area of detection 166 free of this contact. A bottom contact 170 is also applied to the back of the substrate 12 and a negative or zero bias is applied between the top and the bottom contacts 168 and 170 to allow an incoming beam 164 to be detected by the detector.

Figure 10:
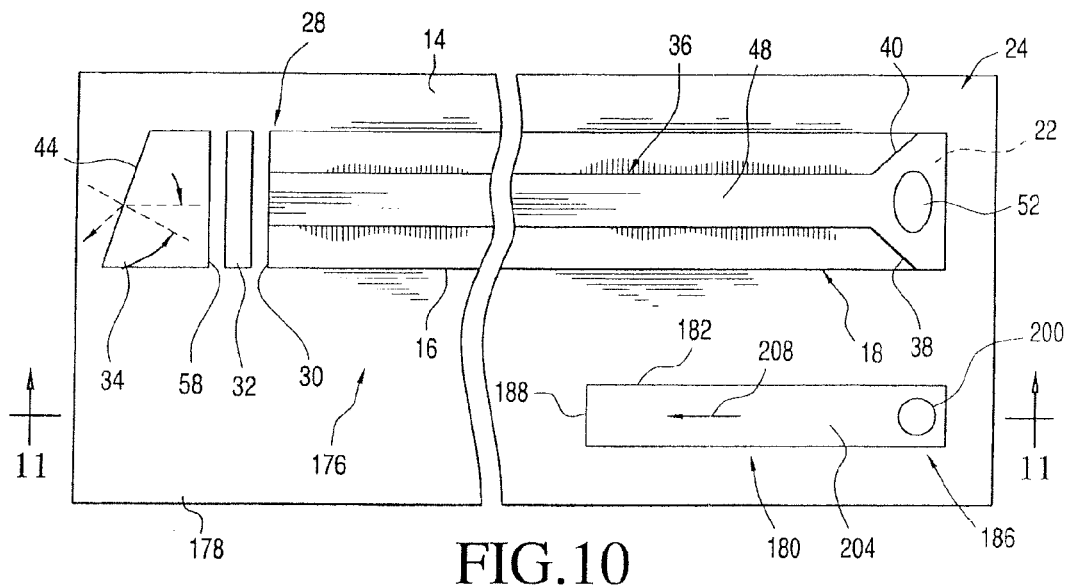
FIG. 10 is a top plan view of a seventh embodiment, combining a surface emitting laser and an in-plane detector.
Figure 11:
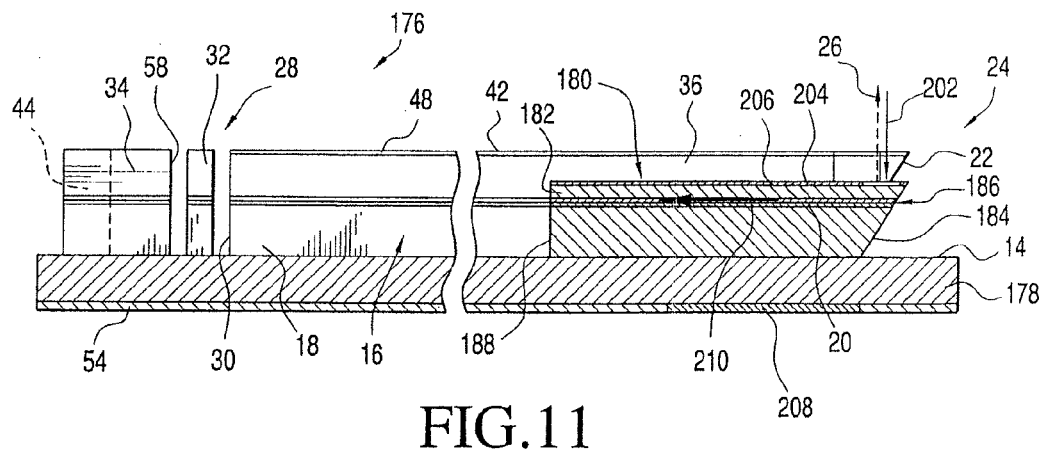
FIG. 11 is a side elevation in partial section of the laser and in-plane detector of FIG. 10.

In another embodiment, illustrated in FIGS. 10 and 11, a surface-emitting laser 176, which may be similar to laser 10 of FIG. 1 for purposes of illustration, is combined with an in-plane detector 180 on a substrate 178. Features in common with the surface-emitting laser 10 of FIGS. 1-3 are similarly numbered, with FIG. 11 being a cross-section taken along lines 11-11 of FIG. 10. For clarity, the detector 180 is shown to have a height smaller than the laser 176 in FIG. 11.

The in-plane detector 180 is located adjacent and generally parallel to the surface-emitting laser 176. Detector 180 incorporates an elongated body portion 182 having a longitudinal axis that is illustrated as being parallel to the axis of the optical cavity 18 of laser 10; however, it will be understood that these axes need not be parallel. The detector body is fabricated in the deposited layers 16 from which the laser optical cavity is formed, using the same masking and etching steps. A reflective input facet 184 is formed at a first, input end 186 of the detector, with facet 184 being etched at or near a 45° angle with respect to the surface of substrate 178 during the formation of facet 22 on laser 10. The body portion 182 and a back facet 188 are formed during the masking and etching steps used to form the second, or reflector, end 28, the vertical end facet 30, the distributed Bragg reflector (DBR) element 32, and the monitoring photo detector (MPD) 34 of laser 176. Although the detector back facet 188 is shown as being perpendicular to the plane of the active layer 20 of the deposited material, it will be understood that this facet can be etched at an angle other than the perpendicular.

The in-plane detector 180 includes a top surface region 200 for receiving an impinging light beam 202 to be detected (FIG. 11), at the same active layer 20 as the one used in the laser. A top electrically conductive contact 204 is applied on the top surface 206 of the detector 180, with an aperture being formed in the contact in the area of detection 200, so that the impinging light is not blocked. A bottom electrically conductive contact 208 is applied to the back of the substrate 12 in the region of the detector, and a negative or zero bias is applied between the top and the bottom contacts. An incoming beam 202 enters the detector through its top surface in the region 200, and is reflected by internally reflective facet 184 to be directed longitudinally along the axis of the detector active layer 20, as illustrated by arrow 210, for detection in known manner.

The reflectivity of areas 166 (FIG. 8) and 200 (FIG. 10) can be modified by depositing a dielectric layer or stack on these areas to provide antireflection surfaces for incoming beams 164 and 202, respectively. This would allow more efficient collection of the light by the detector.

It will be understood that multiple lasers and/or detectors such as those described above can be fabricated on a single substrate in the form of an array, to thereby enable applications such as parallel optical interconnects, wavelength selectivity, and the like. For example, multiple lasers of different wavelengths such as the array 218 illustrated in FIGS. 12 and 13 can be provided on the same chip or substrate, and can be positioned to direct their outputs into a single output medium such as, for example, a fiber. Thus, the array 218 of lasers may be configured to extend radially from a common center or hub 219 with four lasers 220, 222, 224 and 226 of the kind illustrated at 100 in FIG. 7 being positioned on a common substrate 228 in such a way that their respective output ends, 230, 232, 234 and 236 are clustered in close proximity to one another and around a central axis 240, with the second ends of the lasers extending radially outwardly from the hub. The output beams from the lasers are emitted vertically upwardly, in a direction perpendicular or close to perpendicular to the surface of substrate 228 and parallel to axis 240. By providing each of the four lasers with a different bandgap, each laser produces an output beam having a different wavelength, so that the array 218 produces an output along axis 240 of a selected wavelength or combination of wavelengths that may then be directed to a common output device such as an optical fiber 242. Although four lasers are illustrated, it will be understood that this is for purposes of illustration, and that other numbers of lasers may be used. The bandgaps of each laser may be selected through a process such as impurity-free vacancy diffusion or regrowth, with such techniques being well known in the field.

The output ends 230, 232, 234 and 236 of the four lasers each include an angled facet, and these are formed in the same masking step, but with four separate etching steps. A slight deviation from a 45° angle etch in each of the etching steps can be used to guide the four beams slightly away from the perpendicular so that they impinge on the centrally located object, such as the fiber 242. The back facets, filtering elements, and the MPDs for the four lasers are formed through a common masking and etching step. Finally, the ridge structure is formed through masking and etching, and the devices are metallized on the top and the bottom surfaces to provide electrical contacts, as described above.

Figure 12:
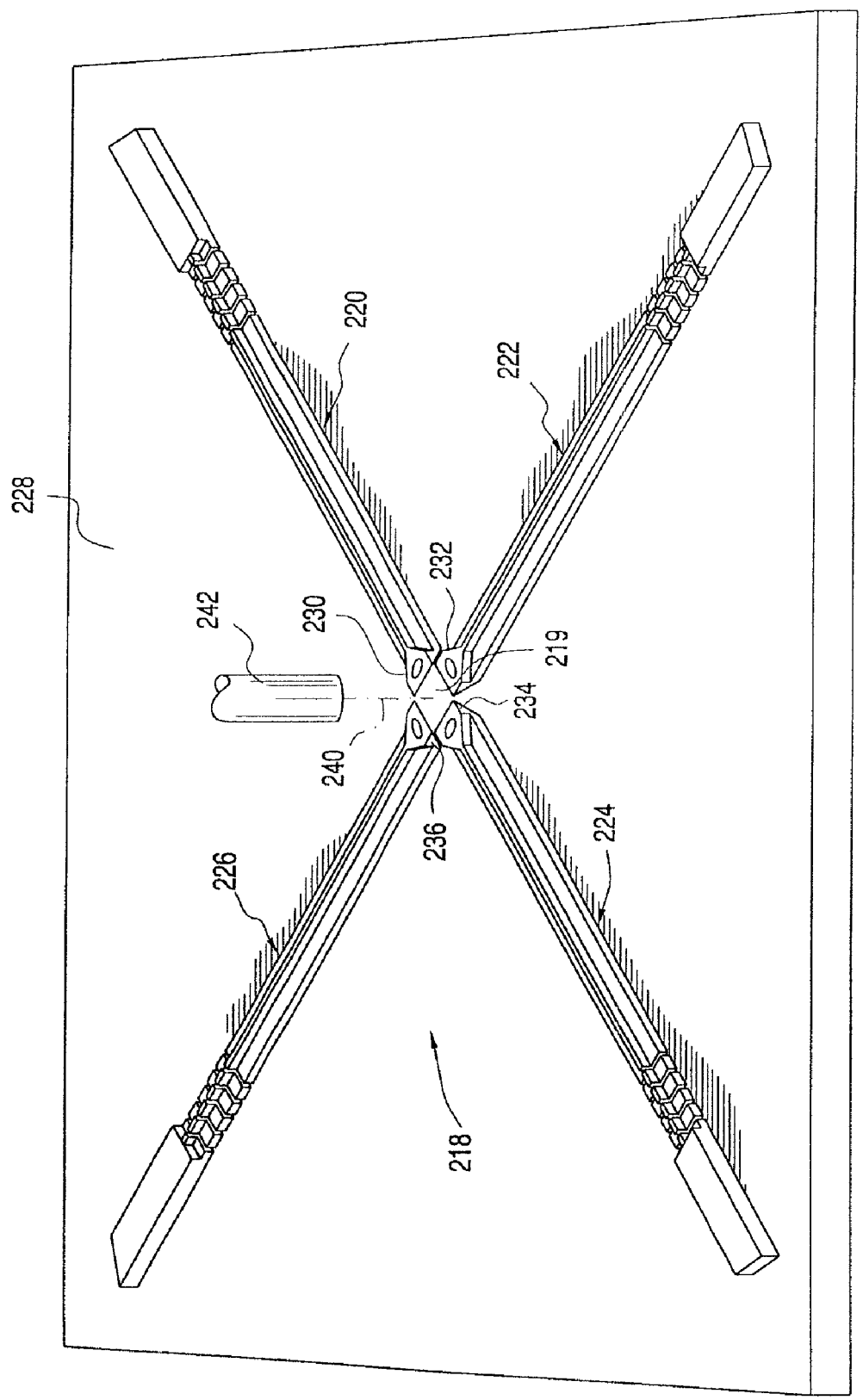
FIG. 12 is a top perspective view of an eighth embodiment, incorporating multiple surface emitting lasers.
Figure 13:
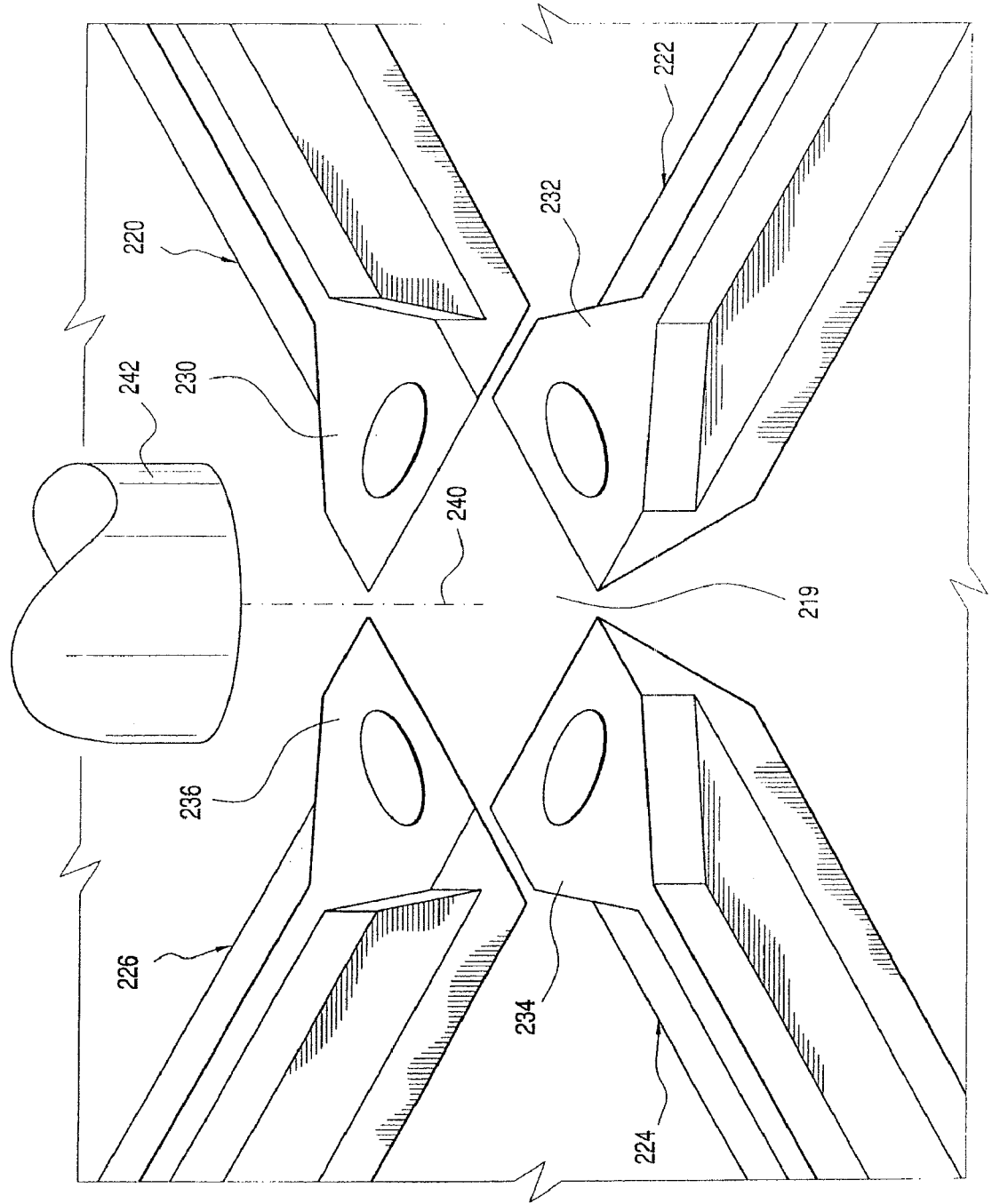
FIG. 13 is an enlarged view of the surface emitting regions of the multiple lasers of FIG. 12.
Figure 14:
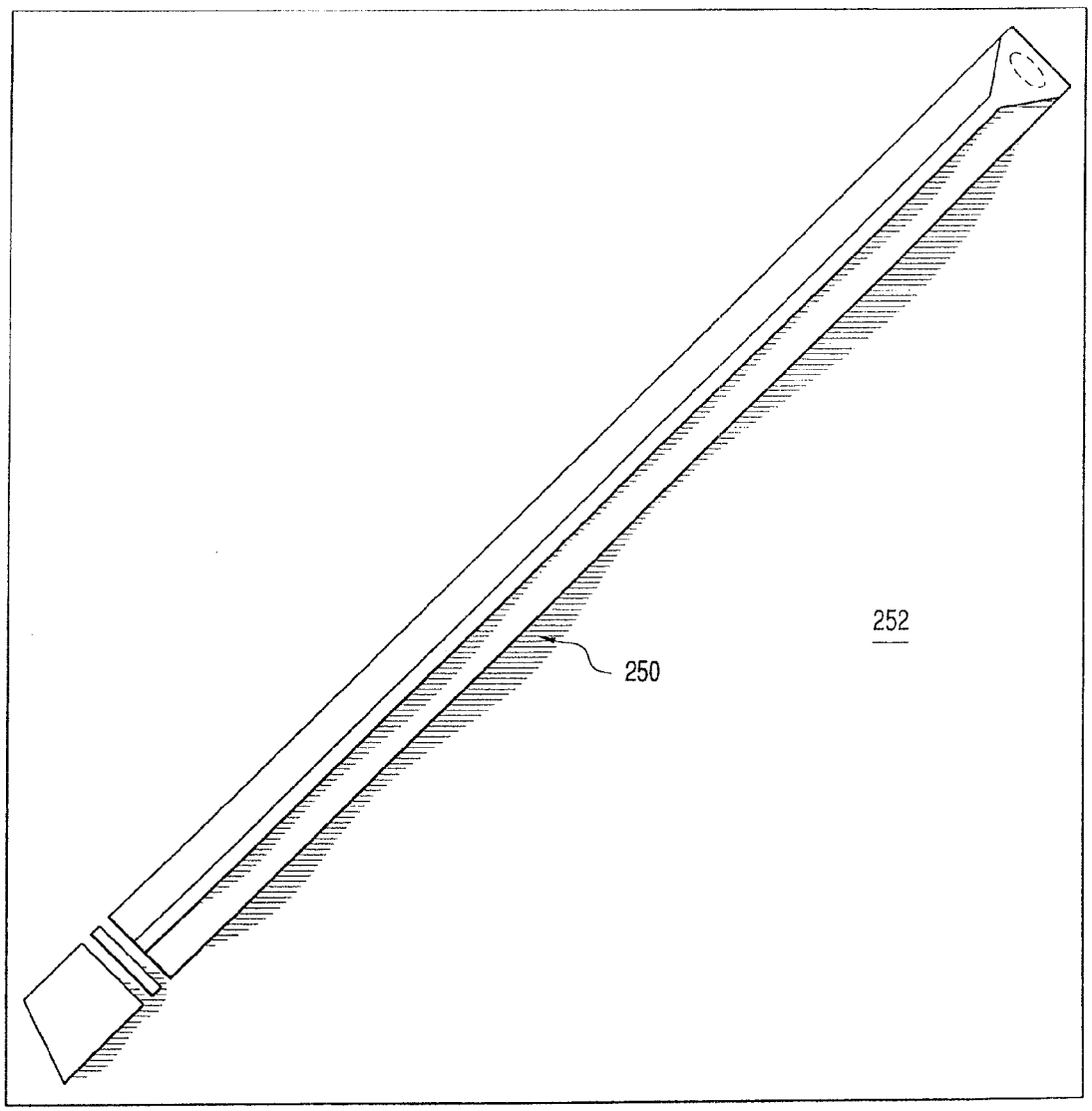
FIG. 14 is a top plan view of a laser positioned for improved packing density.

The radial array 218 of the lasers is possible because the CAIBE (chemically assisted ion beam etching) process that is used in fabricating the lasers provides a uniform etch that does not depend on the crystallographic planes of the semiconductor crystal. This allows surface-emitting lasers to be positioned in any desired configuration on the substrate, as illustrated in FIG. 12 and as further illustrated in FIG. 14, wherein a semiconductor laser 250 is positioned diagonally on a rectangular substrate 252. Conventional methods, using cleaving to form facets for example, do not permit such positioning.

Figure 15:
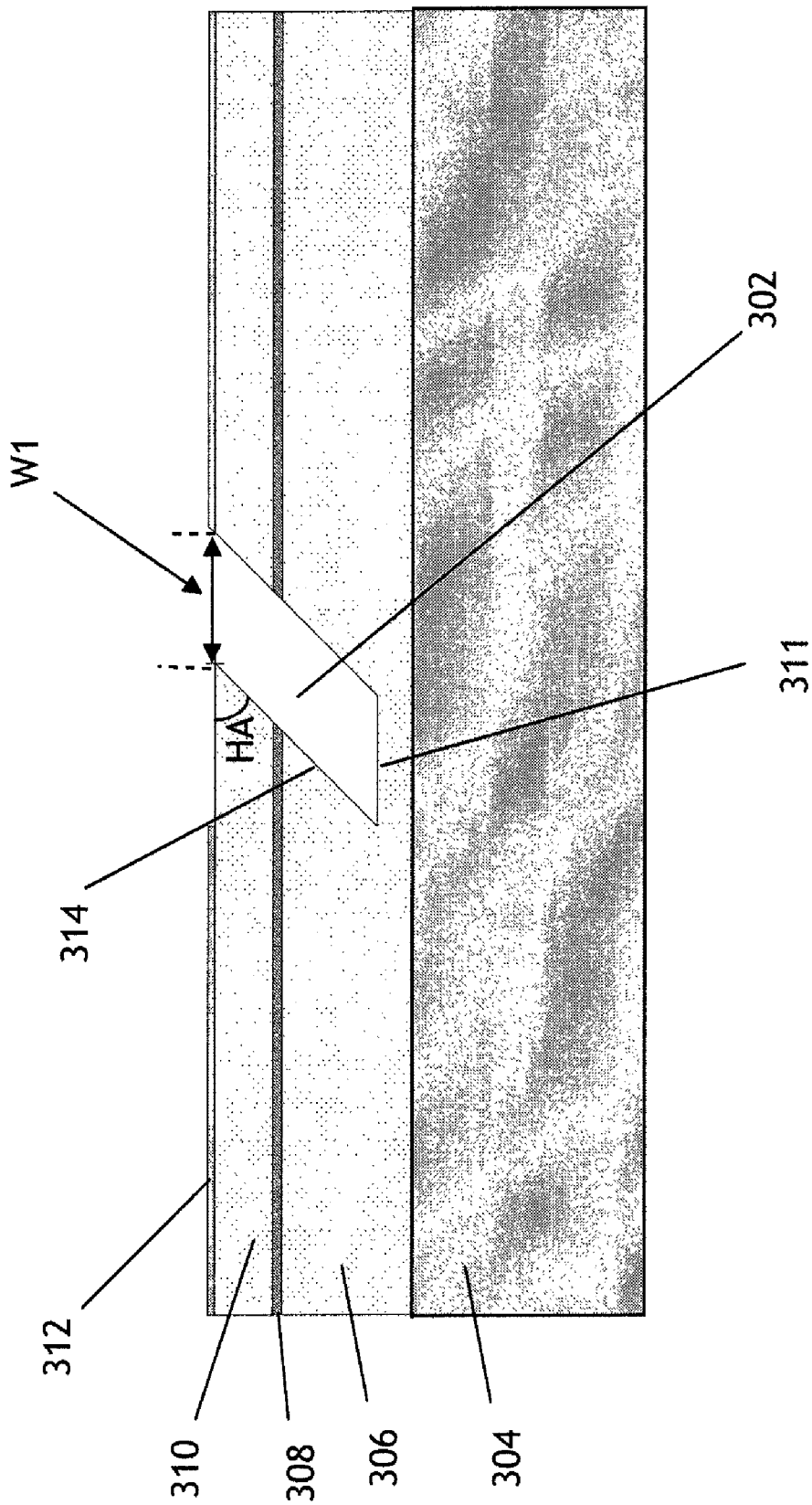
FIG. 15 is a cross-sectional view of the waveguide structure using angled etching only.

FIG. 15 illustrates a cross-section of a waveguide structure 300, such as a laser, with an angled slit 302 having an etched base 311 etched into the waveguide. The waveguide structure 300 comprises a substrate 304, a lower cladding 306, an active region that forms the core 308, an upper cladding layer 310, and a contact layer 312. These layers are epitaxially deposited as described above. The angled etched slit 302 forms the angled etch facet 314 at the waveguide with an angle HA with respect to the longitudinal axis of the waveguide, as illustrated in FIG. 15. The width of this angled slit is W1. The process used to form the structure of FIG. 15 requires an angled etch that can be performed in CAIBE.

Figure 16:
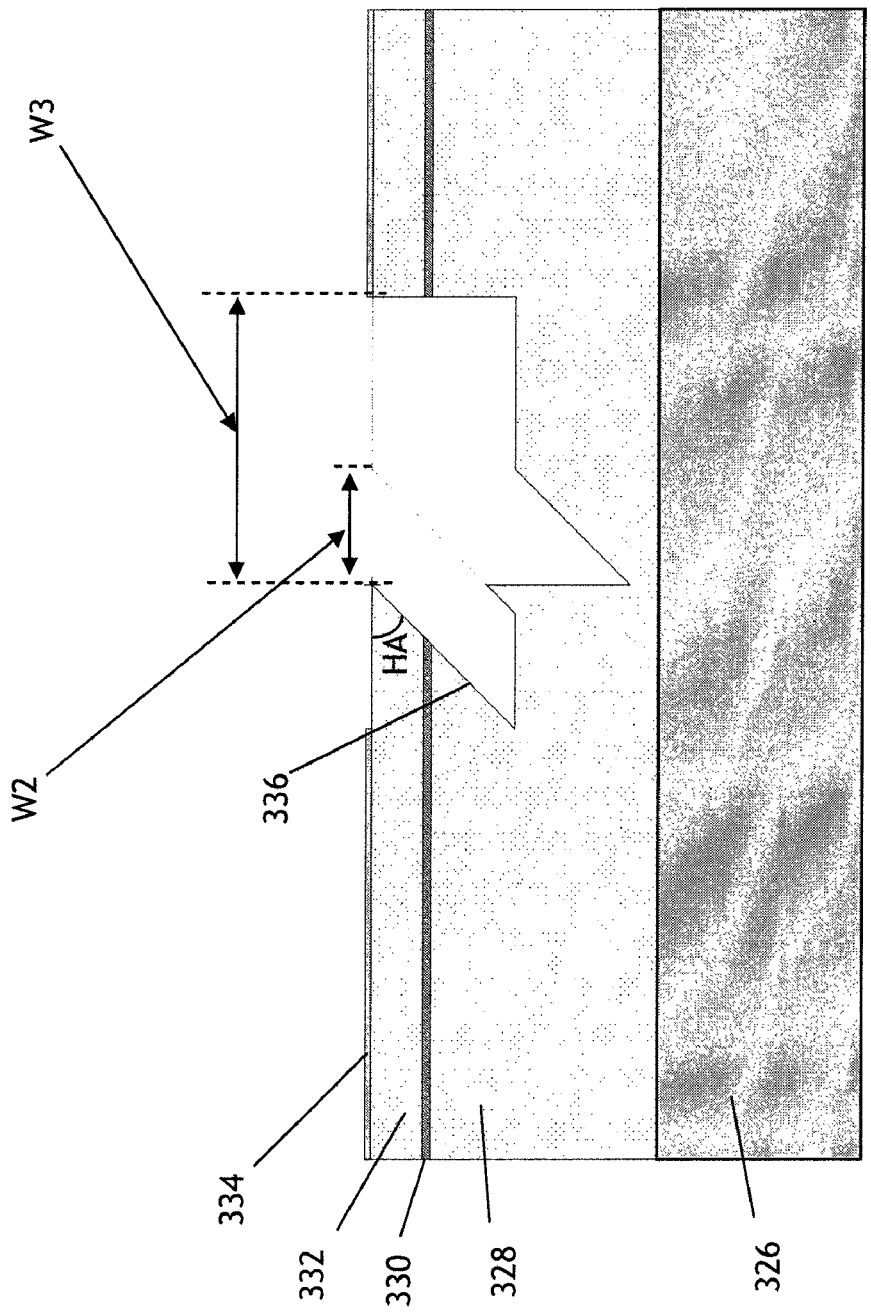
FIG. 16 is a cross-sectional view of the waveguide structure using an angled and perpendicular etching.

FIG. 16 illustrates a cross-section of a waveguide structure 320, such as a laser, with an angled slit 322 as well as a vertical slit 324 etched into the waveguide. The waveguide structure comprises a substrate 326, a lower cladding 328, an active region that forms the core 330, an upper cladding layer 332, and a contact layer 334. These layers are epitaxially deposited as described above. The angled etched slit 322 forms the angled etch facet 336 at the waveguide with an angle HA with respect to the longitudinal axis of the waveguide, as illustrated in FIG. 16. The width of the angled and vertical slits are W2 and W3, respectively. The process used to form the structure of FIG. 16 requires an angled etch as well as a vertical etch, both of which can be performed using CAIBE.

Figure 17:
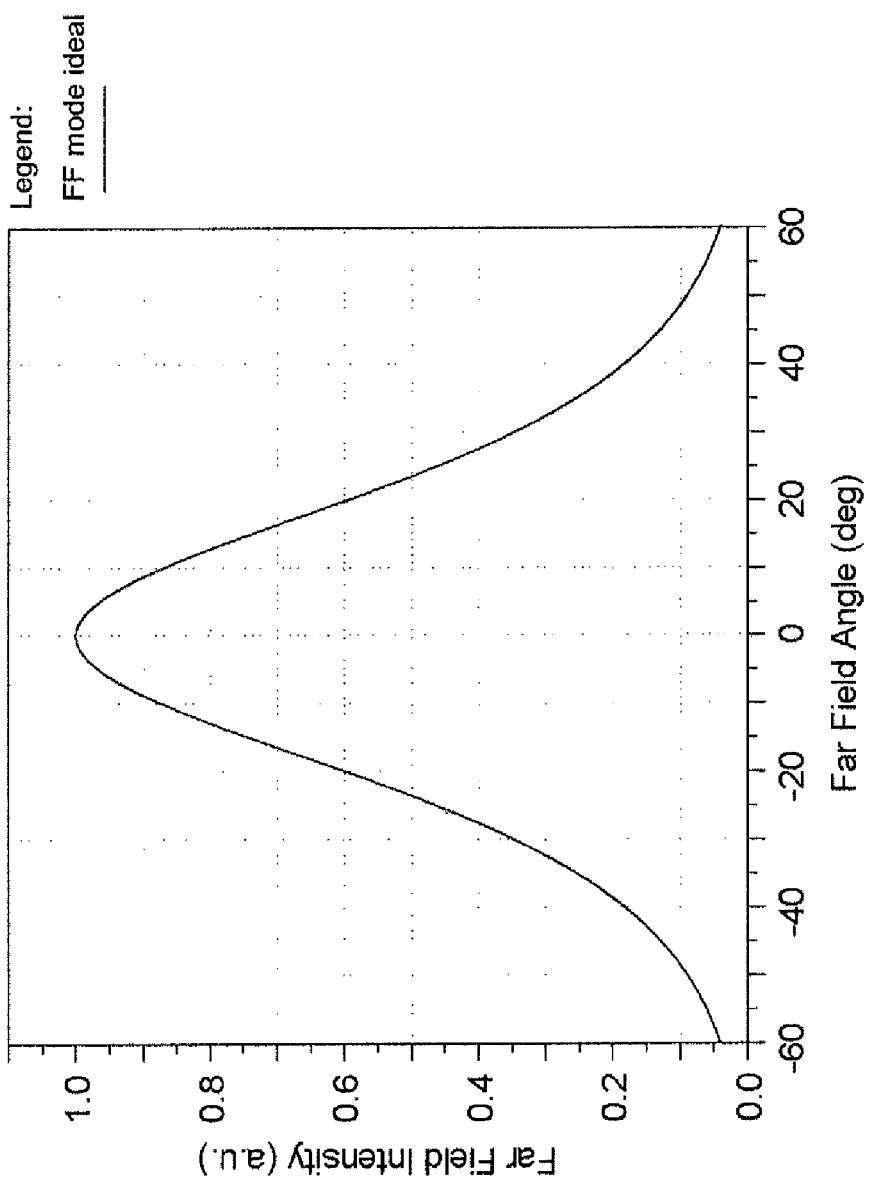
FIG. 17 shows the ideal far-field corresponding to a 1-d waveguide structure for a 1310 nm device having a far-field angle (full-width half maximum of the far-field) of 47°.

FIG. 17 shows the far-field corresponding to a one-dimensional solution in RSoft to an exemplary InP-based 1310 nm emitting epitaxial laser structure and will be referred to as the "ideal" far-field. FIG. 17 shows the case of a 1310 nm laser structure that has a 47° far-field, where the far-field angle is defined as the full-width half-maximum (FWHM) of the far-field. This epitaxial structure is based the following layers on an InP substrate: 0.5 µm n-InP (this layer and the substrate acting as the lower cladding); 0.18 µm AlGaInAs lower graded region; an active region containing fourteen 6 nm thick compressively strained AlGaInAs quantum wells, each sandwiched by 10 nm tensile strained AlGaInAs barriers; 0.18 µm AlGaInAs upper graded region; 1.65 µm thick p-InP upper cladding; and highly p-doped InGaAs cap layer.

FIG. 18(A) shows the refractive index profile of a vertically etched facet 410 in the InP-based 1310 nm emitting epitaxial laser structure. Simulations including all the layers of the epitaxial laser structure show that the structure can be approximated well by using a core 402 that has a refractive index or index of about 3.415 and a thickness of 0.31 µm, the upper and lower cladding layers 404 and 400 that have an index of about 3.2, and air has an index of approximately 1.0. A two-dimensional solution was obtained for this structure through simulation using RSoft Fullwave software and resulted in the far-field shown in FIG. 18(B) with a solid line. The far-field from FIG. 17 is shown in FIG. 18(B) with a dashed line for comparison. Although there is a slight change in shape, there is no beam pointing or ripples in the far-field pattern. The beam pointing is defined as the angle at which the maximum intensity point in the far-field deviates from 0° and here both far-fields show a maximum intensity at 0°, and, hence, no beam pointing.

Figure 19A:
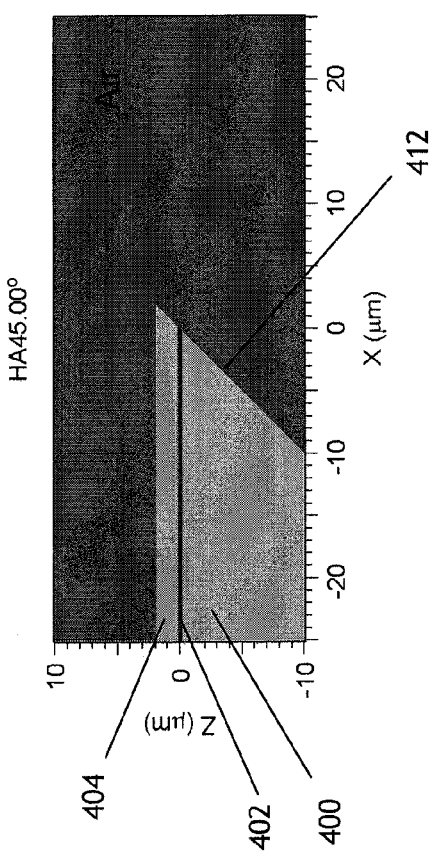
FIGS. 19(A) and (B) show a 2-d waveguide structure with a 45.0° etched facet, the far-field corresponding to this structure, and the far-field from FIG. 17 for comparison.
Figure 19B:
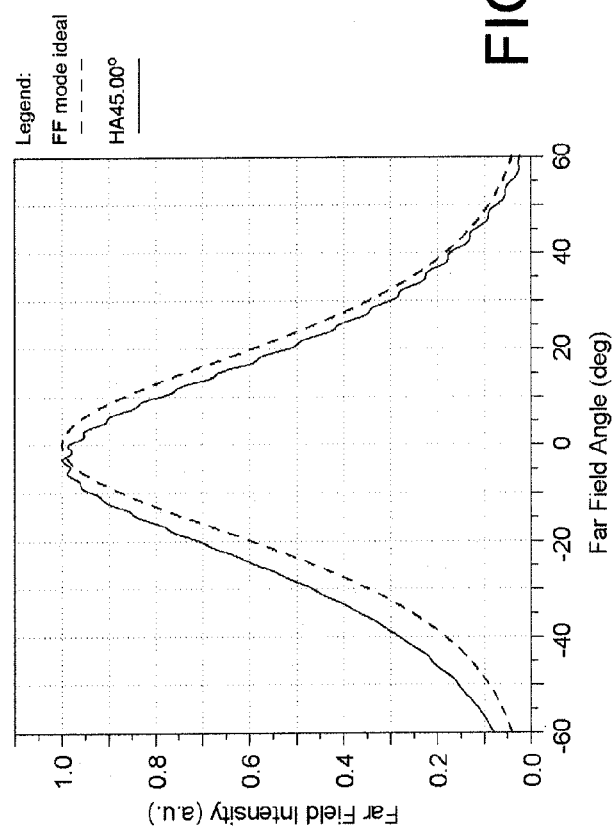

FIG. 19(A) shows the index profile of an etched facet 412 with HA=45° in the InP-based 1310 nm emitting epitaxial laser structure having lower and upper cladding layers 400 and 404 and a core 402. The index values are the same as those presented in connection with the device shown in FIG. 18(A). A two-dimensional solution was obtained for this structure through simulation using RSoft Fullwave software and resulted in the far-field shown in FIG. 19(B) with a solid line. The far-field from FIG. 17 is shown in FIG. 19(B) with a dashed line for comparison. The far-field pattern shows a beam pointing of around −2.5° and small ripples have appears in the far-field pattern.

Figure 20A:
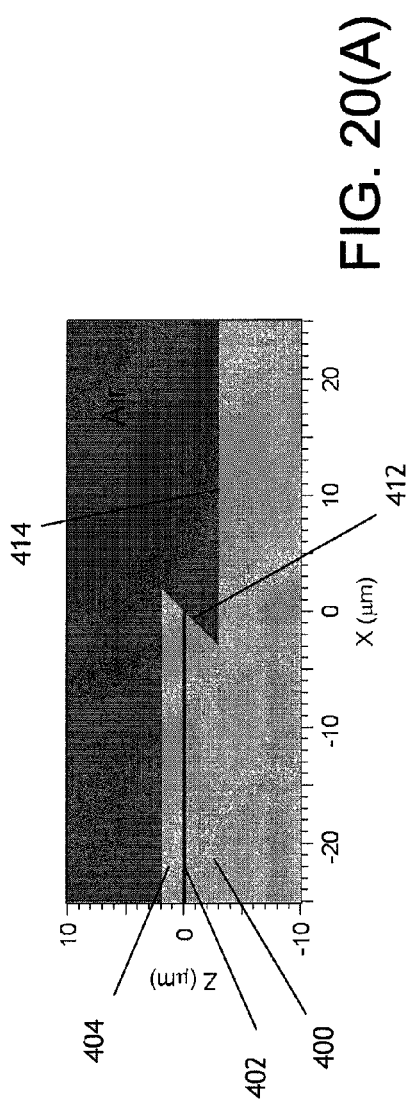
FIGS. 20(A) and (B) show a 2-d waveguide structure with a 45.0° etched facet with an etched base, the far-field corresponding to this structure, and the far-field from FIG. 17 for comparison.
Figure 20B:
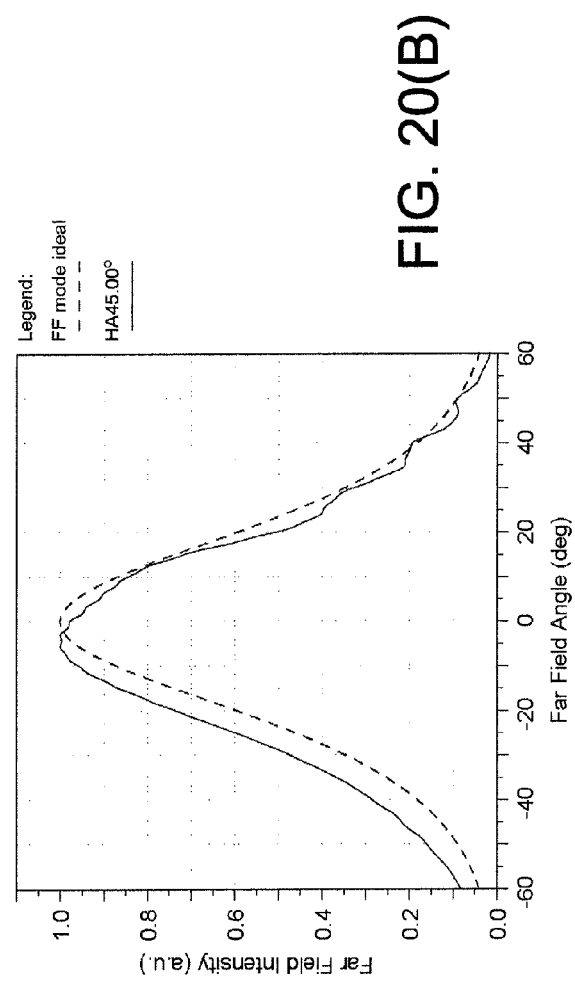

FIG. 20(A) shows the index profile of a more realistic etched facet 412 with HA=45° in the InP-based 1310 nm emitting epitaxial laser structure having lower and upper cladding layers 400 and 404, and a core 402. The index values are the same as those presented in connection with the device shown in FIG. 18(A). This structure now shows the etched based 414 for the etched facet 412. A two-dimensional solution was obtained for this structure through simulation using RSoft Fullwave software and resulted in the far-field shown in FIG. 20(B) with a solid line. The far-field from FIG. 17 is shown in FIG. 20(B) with a dashed line for comparison. The far-field pattern shows a beam pointing of around −5°. The ripples in the far-field have increased over that of the solid curve in FIG. 19(B) and the far-field pattern is more distorted over the ideal far-field pattern.

Figure 21:
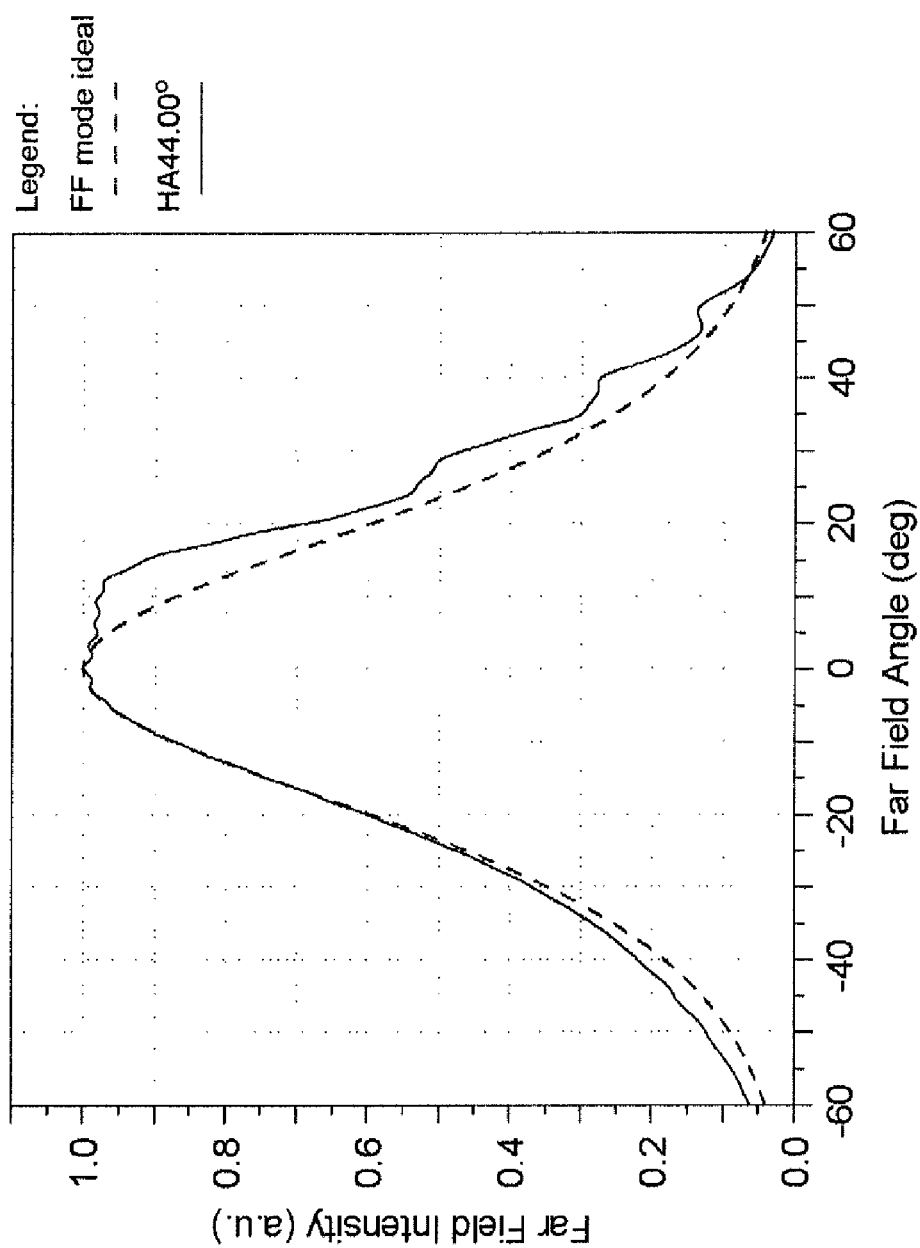
FIG. 21 shows the far-field corresponding to a 2-d waveguide structure with a 44.0° etched facet with an etched base and the far-field from FIG. 17 for comparison.

To decrease the beam pointing in the far-field, the angle HA was reduced from 45.0° to 44.0° in the structure of FIG. 20(A). The two-dimensional solution was obtained for this structure through simulation using RSoft Fullwave software and resulted in the far-field shown in FIG. 21 with a solid line. The far-field from FIG. 17 is shown in FIG. 21 with a dashed line for comparison. The far-field pattern shows almost zero beam pointing, although the intensity in the far-field is not evenly distributed about 0°.

Figure 22:
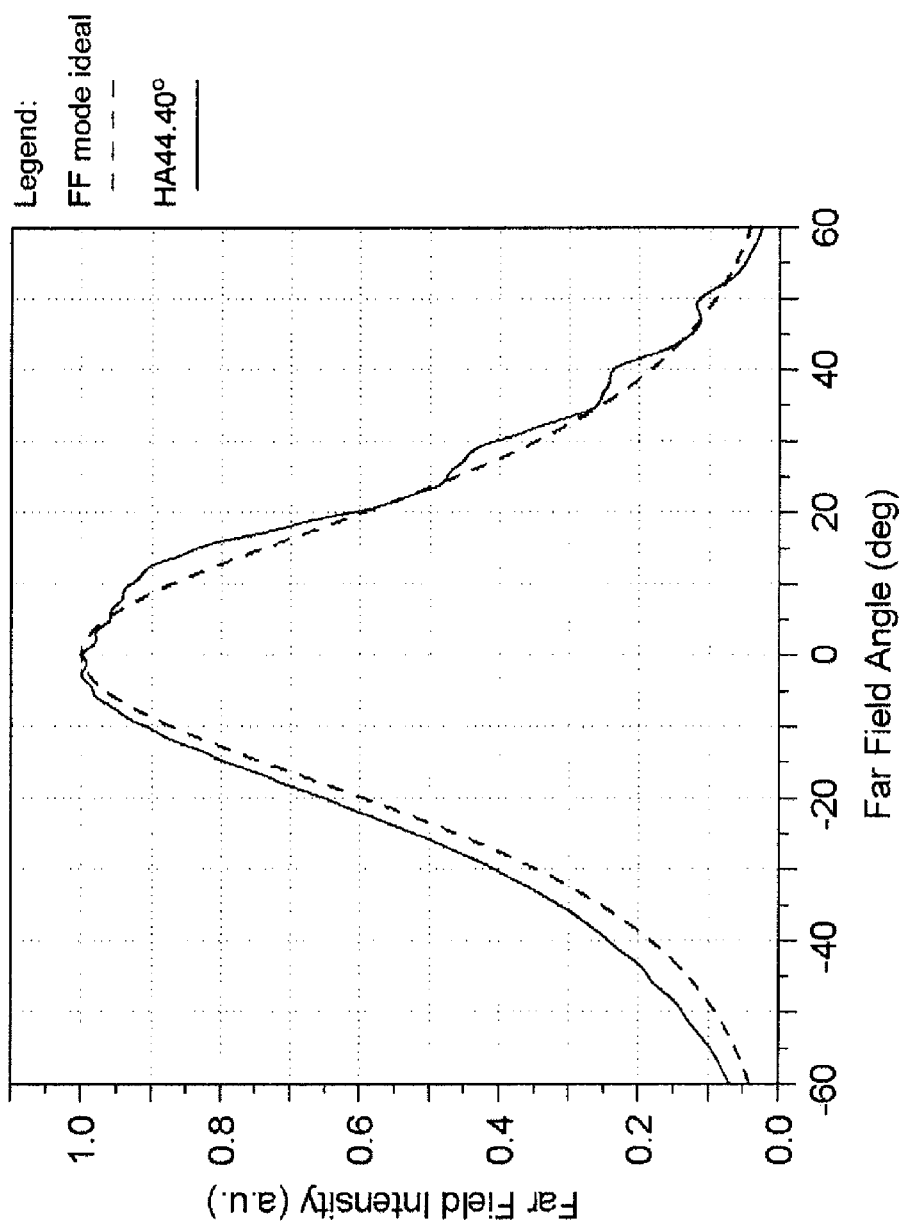
FIG. 22 shows the far-field corresponding to a 2-d waveguide structure with a 44.4° etched facet with an etched base and the far-field from FIG. 17 for comparison.

To balance the intensity about the 0°, the angle HA was changed from 45.0° to 44.4° in the structure of FIG. 20(A). The two-dimensional solution was obtained for this structure through simulation using RSoft Fullwave software and resulted in the far-field shown in FIG. 22 with a solid line. The far-field from FIG. 17 is shown in FIG. 22 with a dashed line for comparison. The far-field pattern shows slight beam pointing, although the intensity in the far-field is now more evenly distributed about 0°. However, the angle HA of the slit with respect to the substrate and a longitudinal axis of the waveguide in the range of 44.4°±1° give rise to reasonable beam pointing.

Figure 23A:
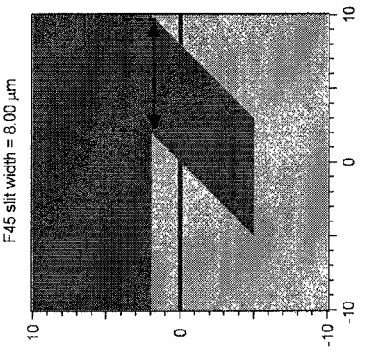
FIGS. 23 (A)-(H) show four 2-d waveguide structures with a 45.0° etched facet with an etched base, each with a different width for the angle-etched slit, and far-fields corresponding to these structures with comparisons with the far-field from FIG. 17.
Figure 23C:
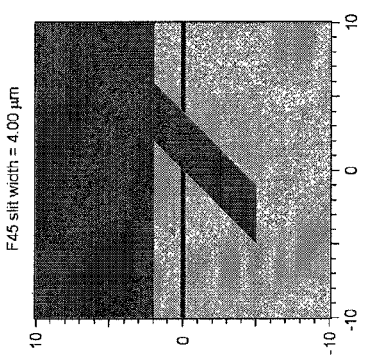
Figure 23E:
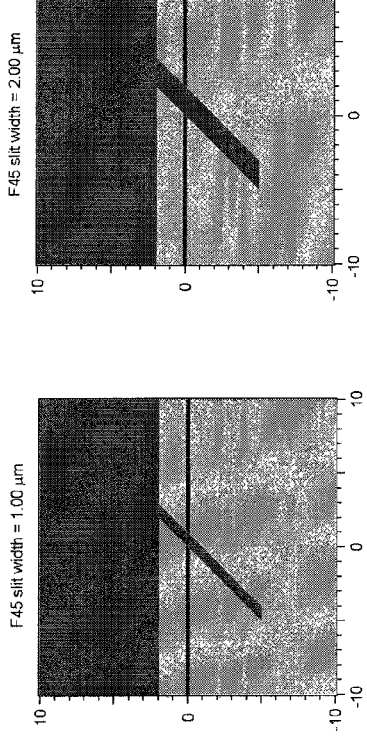
Figure 23G:
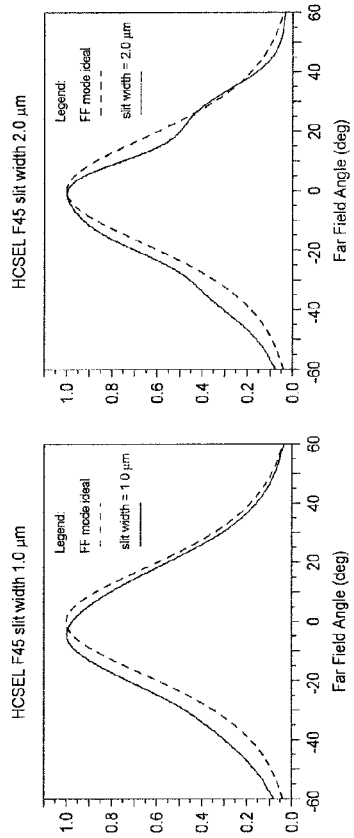
Figure 23B:
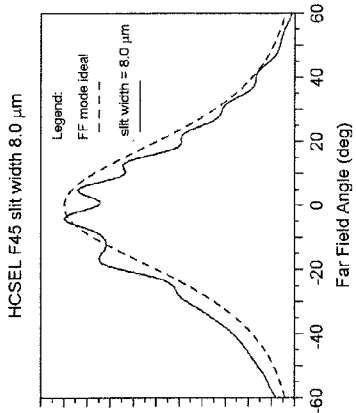
Figure 23D:
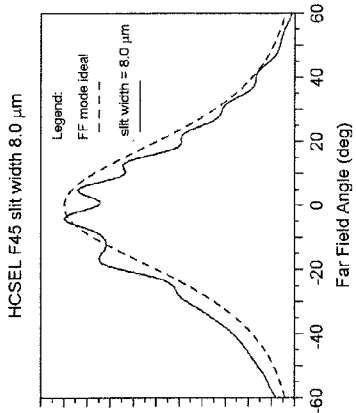
Figure 23F:
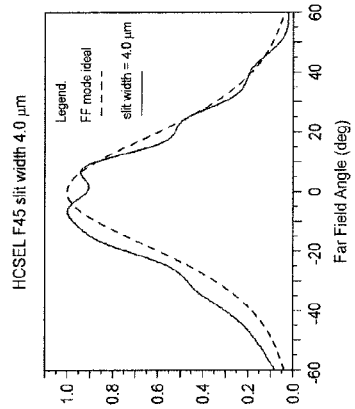
Figure 23H:
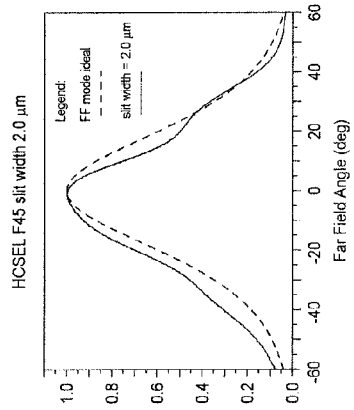

FIGS. 23(A), (C), (E) and (G) show four 2-d waveguide structures with angled etched facets; etched bases; and HA=45.0°, each with a different width for the angle-etched slit. This is the type of structure illustrated in FIG. 15. Two-dimensional solution for each of the four structures were obtained through simulations using RSoft Fullwave software and resulted in the far-fields shown in FIGS. 23(B), (D), (F) and (H) with a solid line. The far-field from FIG. 17 is shown FIGS. 23(B), (D), (F) and (H) with a dashed line for comparison. The far-field pattern corresponding to the 1μm slit shows no noticeable ripples and a beam pointing angle of around −5°. The far-fields corresponding to 2, 4, and 16 μm slits show increasing ripples with slit width.

Figure 24A:
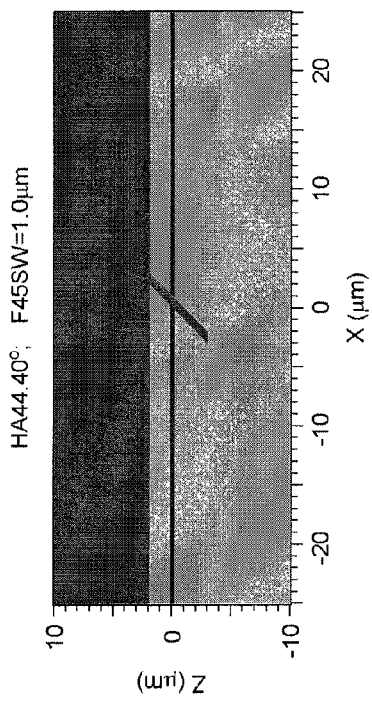
FIGS. 24(A) and (B) show a 2-d waveguide structure with a 44.4° etched facet with a width of 1 μm for the angle-etched slit and an etched base, the far-field corresponding to this structure, and the far-field from FIG. 17 for comparison.
Figure 24B:
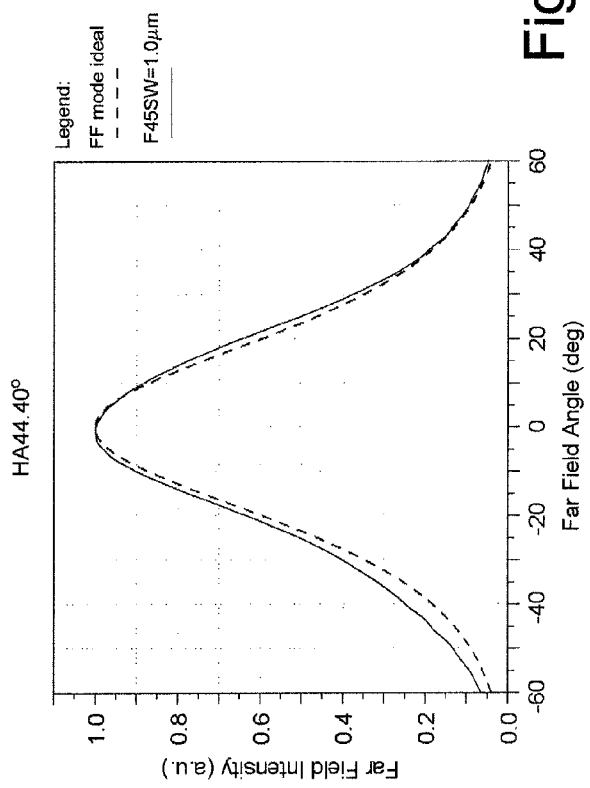

FIG. 24(A) shows a 2-d waveguide structure with an angled etched facet; an etched base; and HA=44.4°, with a width of 1 μm for the angled-etched slit. This is also the type of structure illustrated in FIG. 15. The two-dimensional solution was obtained for this structure through simulation using RSoft Fullwave software and resulted in the far-field shown in FIG. 24(B) with a solid line. The far-field from FIG. 17 is shown FIG. 24(B) with a dashed line for comparison. The far-field doesn't have any noticeable ripples and a beam pointing angle at or around 0°.

Figure 25A:
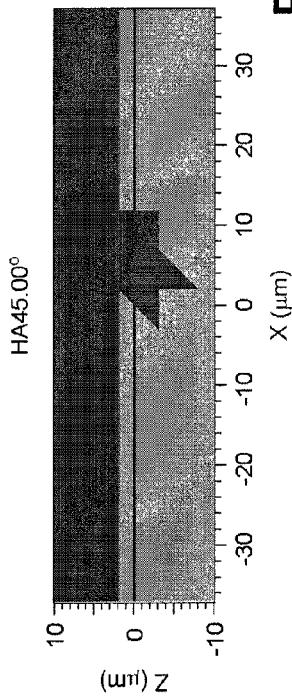
FIGS. 25(A) and (B) shows a 2-d waveguide structure with a 45.0° etched facet with a width of 1 μm for the angle-etched slit and an etched base; a vertical-etched slit with a width of 10 μm and etched base, the far-field corresponding to this structure, and the far-field from FIG. 17 for comparison.
Figure 25B:
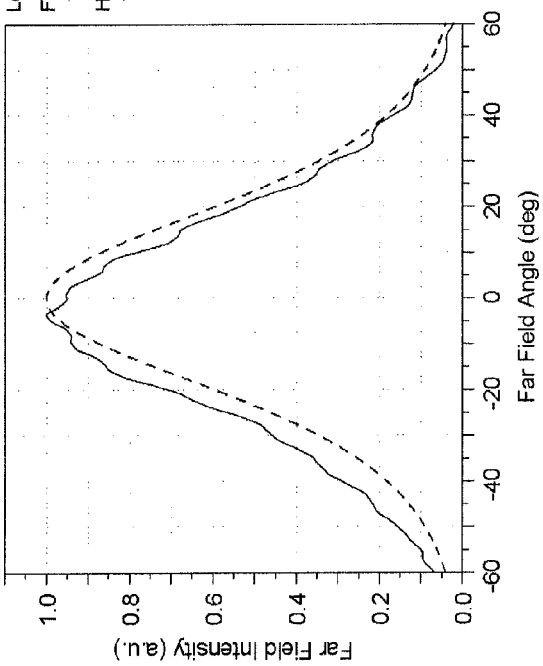

FIG. 25(A) shows a 2-d waveguide structure with an angled etched facet; an etched base; and HA=45.0°. The structure is of the type illustrated in FIG. 16 where both an angled etch and a vertical etch are used to create the structure. The angled etch is performed first and the width is 5 μm for the angled-etched slit. The vertical etched is performed next and the width is 10 μm for the vertical-etched slit. The two-dimensional solution was obtained for this structure through simulation using RSoft Fullwave software and resulted in the far-field shown in FIG. 25(B) with a solid line. The far-field from FIG. 17 is shown FIG. 25(B) with a dashed line for comparison. The far-field has some ripples and a beam pointing angle is around −4°.

Figure 26:
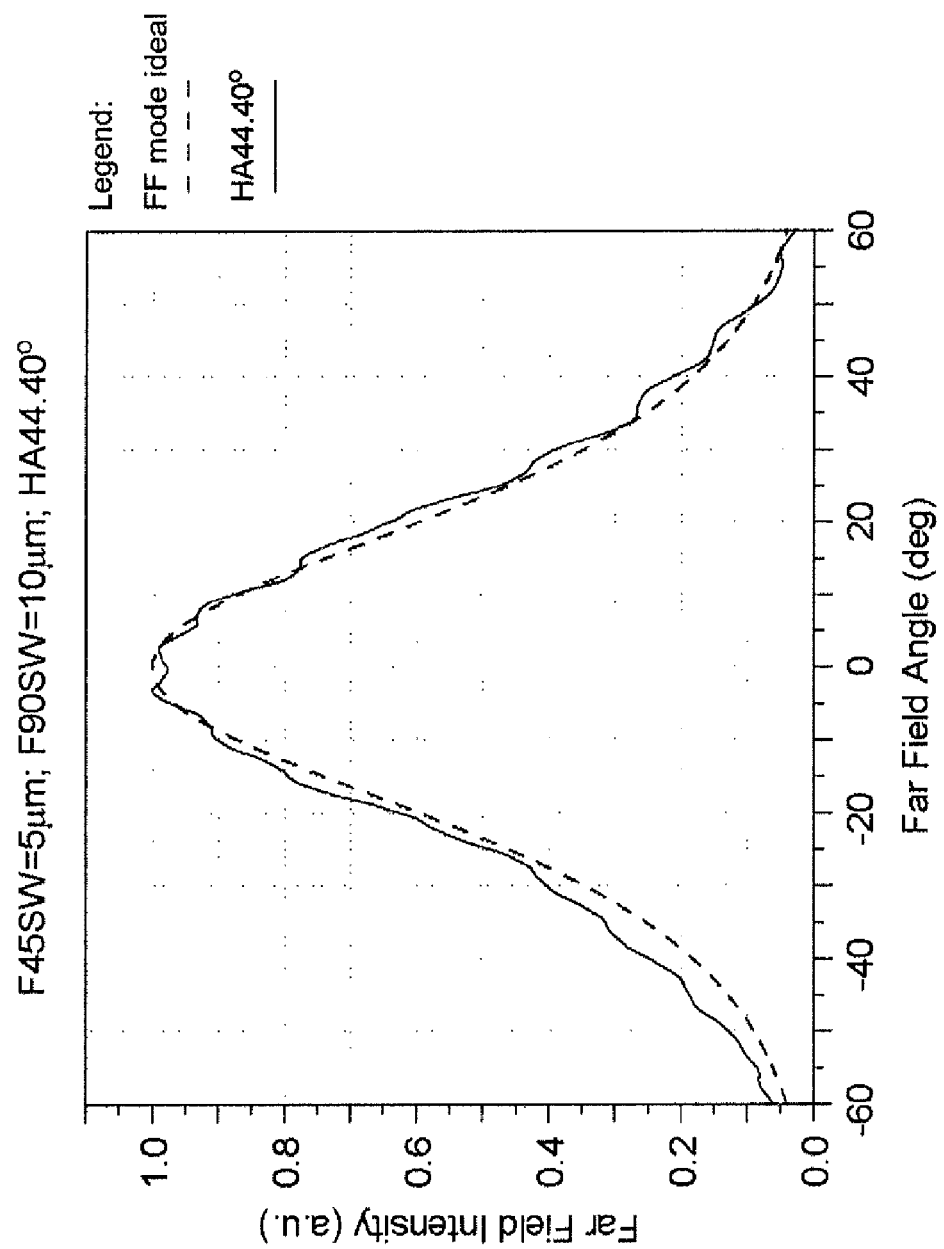
FIG. 26 shows the far-field corresponding to a 2-d waveguide structure with a 44.4° etched facet with a width of 1 μm for the angle-etched slit and an etched base; a vertical-etched slit with a width of 10 μm and etched base, the far-field corresponding to this structure, and the far-field from FIG. 17 for comparison.

To decrease the beam pointing in the far-field, the angle HA was reduced from 45.0° to 44.0° in the structure of FIG. 25(A). The two-dimensional solution was obtained for this structure through simulation using RSoft Fullwave software and resulted in the far-field shown in FIG. 26 with a solid line. The far-field from FIG. 17 is shown in FIG. 26 with a dashed line for comparison. The far-field pattern shows slight beam pointing and the intensity in the far-field is evenly distributed about 0°.

Figures 27A, 27B, 27C:
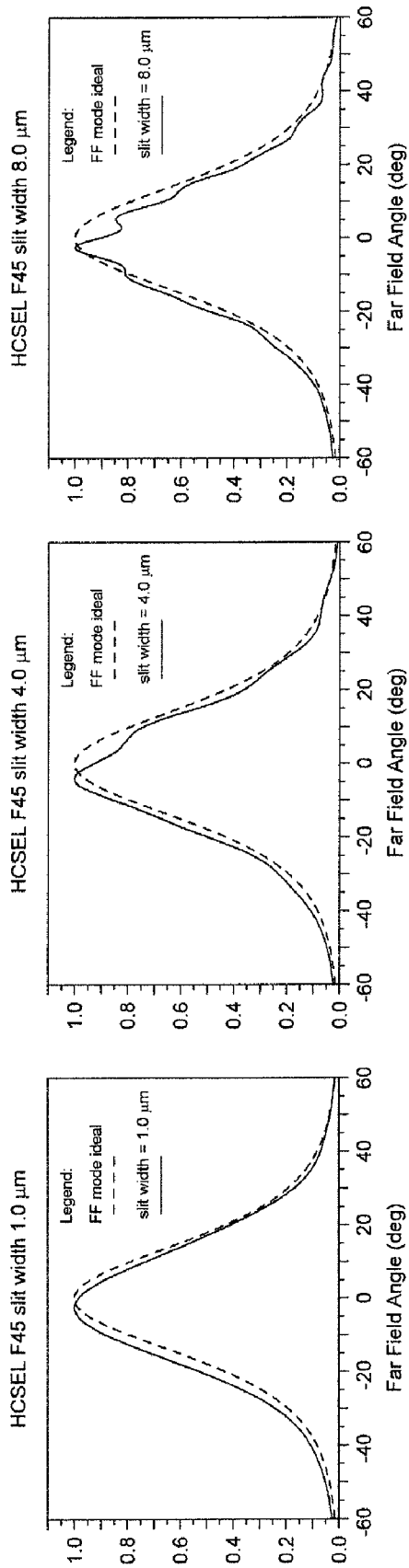
FIGS. 27(A)-(C) show the far-fields corresponding to a 2-d waveguide structures with a 45.0° etched facet with an etched slit widths of 1, 4, and 8 μm for the angle-etched slit and the ideal far-field for the 1-d structure for comparison, where a 1310 nm device has a far-field angle of 35°.
Figures 28A, 28B, 28C:
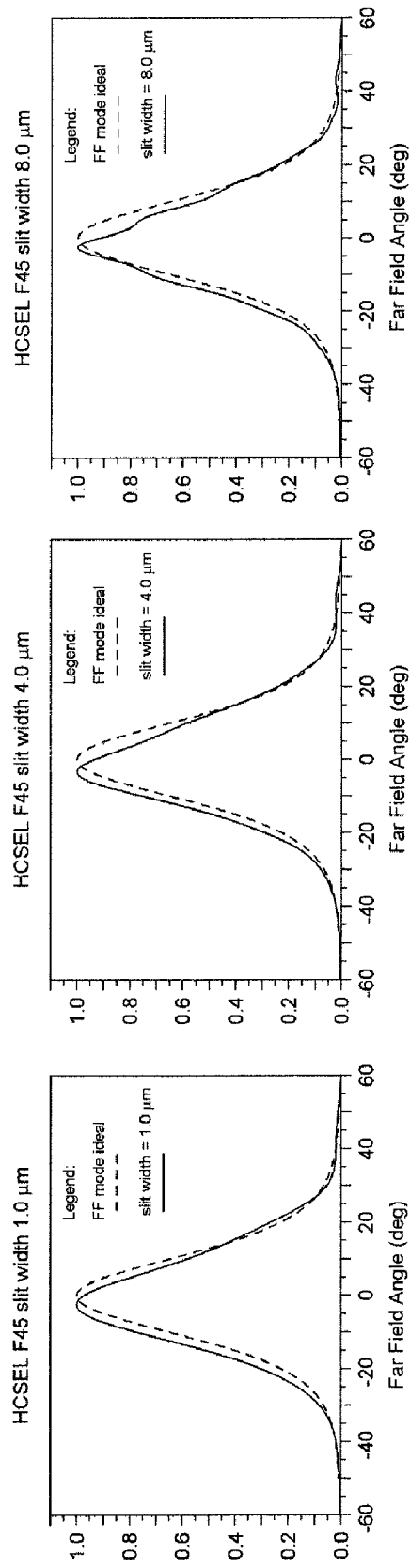
FIGS. 28(A)-(C) show the far-fields corresponding to a 2-d waveguide structures with a 45.0° etched facet with an etched slit widths of 1, 4, and 8 μm for the angle-etched slit and the ideal far-field for the 1-d structure for comparison, where a 1310 nm device has a far-field angle of 25°.

By using the 1310 nm emitting epitaxial structure with the following layers on an InP substrate: 0.5 μm n-InP; 0.105 μm AlGaInAs lower graded region; an active region containing five 6 nm thick compressively strained AlGaInAs quantum wells, each sandwiched by 10 nm tensile strained AlGaInAs barriers; 0.105 μm AlGaInAs upper graded region; 1.65 μm thick p-InP upper cladding; and highly p-doped InGaAs cap layer, the far-field was angle to 35°. This is shown as the ideal far-field, corresponding to the 1-d structure, in FIG. 27. Simulations including all the layers of the epitaxial laser structure show that the structure can be approximated well by using a core with an index of about 3.325 and a thickness of 0.34 μm, and upper and lower cladding layers of an index of about 3.2. Further reduction in the far-field angle to 25° is obtained by using the 1310 nm emitting epitaxial structure with the following layers on an InP substrate: 0.5 μm n-InP; 0.045 μm AlGaInAs lower graded region; an active region containing three 6 nm thick compressively strained AlGaInAs quantum wells, each sandwiched by 10 nm tensile strained AlGaInAs barriers; 0.045 μm AlGaInAs upper graded region; 2.45 μm thick p-InP upper cladding; and highly p-doped InGaAs cap layer, as shown in FIG. 28 for the ideal far-field, corresponding to the 1-d structure. Simulations including all the layers of the epitaxial laser structure show that the structure can be approximated well by using a core with an index of about 3.207 and a thickness of 0.34 μm, and upper and lower cladding layers of an index of about 3.2. Comparing FIGS. 23, 27, and 28, the 2-d far-field shows less ripples and structure for smaller far-field angles for a given slit width.

Figures 29A, 29B, 29C:
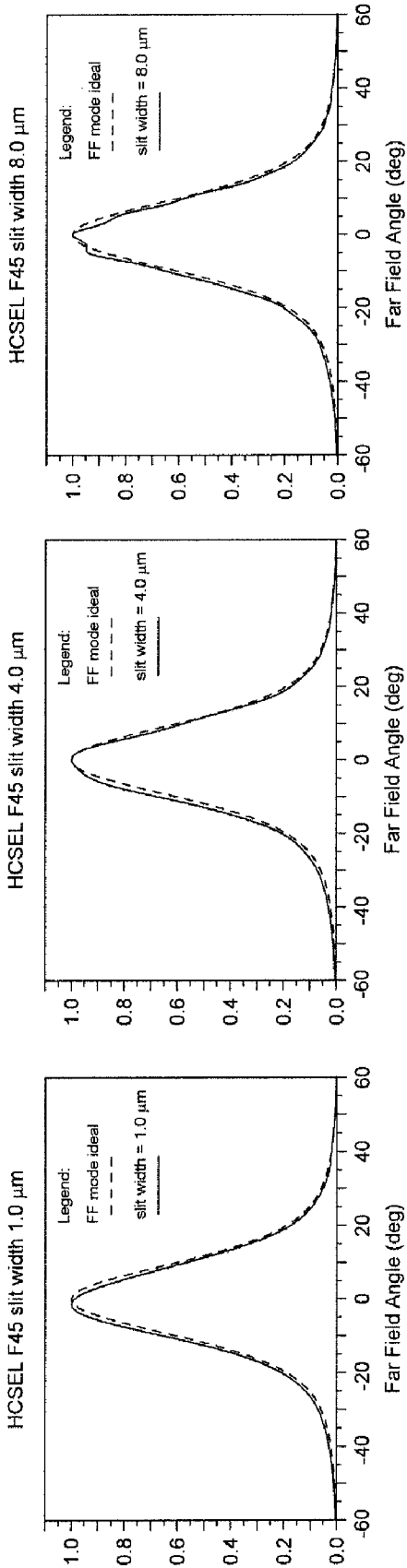
FIGS. 29(A)-(C) show the far-fields corresponding to a 2-d waveguide structures with a 45.0° etched facet with an etched slit widths of 1, 4, and 8 μm for the angle-etched slit and the ideal far-field for the 1-d structure for comparison, where an 830 nm device has a far-field angle of 23°.

FIG. 29 shows the case of an 830 nm emitting epitaxial structure is based the following layers on a GaAs substrate: 2.0 μm n-$Al_{0.4}Ga_{0.6}As$ lower cladding; 0.1 μm $Al_{0.25}Ga_{0.75}As$ to $Al_{0.4}Ga_{0.6}As$ lower graded region; an active region containing a single 7.5 nm thick GaAs quantum well; 0.1 μm $Al_{0.4}Ga_{0.6}As$ to $Al_{0.25}Ga_{0.75}As$ upper graded region; 2.0 μm thick p-$Al_{0.4}Ga_{0.6}As$ upper cladding; and highly p-doped GaAs cap layer, with a far-field angle of 23° for the corresponding 1-d structure. Simulations including all the layers of the epitaxial laser structure show that the structure can be approximated well by using a core with an index of about 3.41223 and a thickness of 0.18 μm, and upper and lower cladding layers of an index of about 3.34. The 2-d far-field has small structure and ripples even at 8 μm slit.

In some cases, the etched base of a slit may be rounded, as shown in the index profiles for the 2-d waveguide structures in FIG. 30, based on the same epitaxial structure used for FIG. 23. The dashed lines show the 2-d far-fields for various slit widths are also shown in FIG. 30 and shows minimal differences with the far-field shapes observed in FIG. 23.

Far-field measurements from fabricated devices show results consistent with the simulations.

Generally, ripples are undesirable in the far-field pattern for most applications. The control in the beam pointing angle is important in many applications. Some applications benefit from a beam pointing angle since it allows coupling to the fiber with elimination of reflection from the fiber from coupling back into the fiber. However, in other situations zero beam pointing gives the best results.

Although the present invention has been illustrated in terms of various embodiments, it will be understood that variations and modifications may be made without departing from the true spirit and scope thereof as set out in the following claims.

What is claimed is:
1. A surface emitting photonic device comprising:
a substrate; and
a waveguide structure on the substrate, said waveguide structure including an active region along a longitudinal axis of the waveguide structure, said active region for generating light, wherein the waveguide structure has a trench formed therein transverse to and intersecting the active region in the waveguide structure, a first side of the trench forming an angled facet at one location along the waveguide structure and a second side of the trench forming a wall at a second location along the waveguide structure, said angled facet having a normal that is at a non-parallel angle relative to the longitudinal axis of the waveguide structure, and wherein the active region of the waveguide structure is interrupted by the trench between the first and second sides of the trench.

2. The device of claim 1, wherein the first and second sides of the trench define an opening in waveguide structure that is no greater than 8 μm across.

3. The device of claim 1, wherein the first and second sides of the trench define an opening in waveguide structure that is no greater than 4 μm across.

4. The device of claim 1, wherein the first and second sides of the trench define an opening in waveguide structure that is no greater than 1 μm across.

5. The device of claim 1, wherein said waveguide structure comprises a semiconductor material.

6. The device of claim 5, wherein the waveguide structure has a top surface and the first side of the trench is at an angle relative to the top surface of about 44.4°±1°.

7. The device of claim 1, wherein said angled facet is internally reflective and angled to cause light generated in said active region to be emitted in a direction that is substantially perpendicular to said substrate.

8. The device of claim 1, wherein said waveguide structure comprises multiple layers on a top surface of said substrate and said active region is substantially parallel to said top surface.

9. The device of claim 8, further including electrodes on the waveguide structure and the substrate for receiving a bias voltage to activate the waveguide structure to generate a laser output beam.

10. The device of claim 9, wherein said device is a ridge laser, Fabry Perot (FP) laser or a distributed feedback (DFB) laser.

11. The device of claim 10, wherein said ridge laser is a Fabry Perot laser.

12. The device of claim 10, wherein said ridge laser is a distributed feedback. laser.

13. The device of claim 9, wherein said device is a buried heterostructure laser.

14. The device of claim 13, wherein said buried heterostructure laser is a Fabry Perot laser.

15. The device of claim 13, wherein said buried heterostructure laser is a distributed feedback laser.

16. The device of claim 1, wherein said waveguide structure is shaped to form an elongated laser cavity having said angled facet at a first end of said cavity and having another facet at a second end of the cavity.

17. The device of claim 1, wherein said trench has an etched base.

18. The device of claim 17, wherein said etched base contains a portion that is parallel to the substrate.

19. The device of claim 17, wherein said at least a portion of said etched base is rounded.

20. The device of claim 1, wherein said wall at the second location has a normal that is parallel to the longitudinal axis of the waveguide structure.

21. The device of claim 1, wherein the trench divides the waveguide structure into a first portion and a second portion, wherein the angled facet is located at a first end of the first portion of the waveguide structure and the wall is located on the second portion of the waveguide structure, wherein the first portion of the waveguide structure also includes an end facet, and wherein the angled facet and the end facet form an optical cavity within the first portion of the waveguide structure.

* * * * *